United States Patent
Warren et al.

(10) Patent No.: US 11,539,397 B2
(45) Date of Patent: Dec. 27, 2022

(54) POWER EXTENDER FOR SMART-HOME CONTROLLERS USING 2-WIRE COMMUNICATION

(71) Applicant: Google LLC, Mountain View, CA (US)

(72) Inventors: Daniel Adam Warren, Portola Valley, CA (US); Michael Mitchell, San Francisco, CA (US); Nathan Lentz, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/131,062

(22) Filed: Dec. 22, 2020

(65) Prior Publication Data
US 2022/0200658 A1    Jun. 23, 2022

(51) Int. Cl.
| H02M 7/21 | (2006.01) |
| H03K 5/00 | (2006.01) |
| H04B 3/54 | (2006.01) |
| H02M 7/217 | (2006.01) |

(52) U.S. Cl.
CPC ............ *H04B 3/542* (2013.01); *H02M 7/217* (2013.01); *H03K 5/00* (2013.01); *H03K 2005/00013* (2013.01)

(58) Field of Classification Search
CPC ...... F24F 11/88; F24D 19/1084; H04B 3/542; H03K 2005/00013; H02J 13/00016; H02J 1/06; H02J 2310/14; G05F 1/614
See application file for complete search history.

(56) References Cited

U.S. PATENT DOCUMENTS

| 10,819,148 | B2 | 10/2020 | Warren et al. | |
| 10,921,014 | B1* | 2/2021 | Walsh | H02M 7/06 |
| 2012/0248211 | A1* | 10/2012 | Warren | G05D 23/19 |
| | | | | 236/1 C |
| 2014/0000858 | A1* | 1/2014 | Frank | G05D 23/1905 |
| | | | | 165/201 |
| 2017/0284693 | A1* | 10/2017 | Robledo | F24F 11/30 |

(Continued)

OTHER PUBLICATIONS

TS-2PE01, Power Extender Kit, Intallation Instructions, Oct. 2014 (Year: 2014).*

(Continued)

*Primary Examiner* — Aristocratis Fotakis
(74) *Attorney, Agent, or Firm* — Kilpatrick Townsend & Stockton LLP

(57) ABSTRACT

A method of powering a controller using an intermediate device with power from an environmental system may include receiving current from a power wire from the environmental system; passing the current from the power wire to a second command wire from the controller; monitoring the current flowing between the power wire and the second command wire while the current is below a threshold indicative of an amount of current used to power the controller from the environmental system; detecting when the current flowing between the power wire and the second command wire exceeds the threshold indicating that the controller is sending a command to the environmental system to perform the function; and sending a command to environmental system using a first command wire from the environmental system after detecting that the current exceeds the threshold.

24 Claims, 18 Drawing Sheets

(56) References Cited

U.S. PATENT DOCUMENTS

2019/0064857 A1* 2/2019 Metselaar .............. G05D 23/19
2019/0384334 A1* 12/2019 Warren .................... H02J 1/06

OTHER PUBLICATIONS

C-Wire Adapter, Installation Guide, Honeywell, May 2018 (Year: 2018).*
Fast-Stat, HVAC Wiring Extender, Model 1000, Installation Instructions, Nordic Technology, 2019 (Year: 2019).*
Power Extender Kit, User Manual, Ecobee, 2013 (Year: 2013).*
Add-A-Wire Accessory, Installation Instructions, Model ACC0410, VenStar. Feb. 2012 (Year: 2012).*

* cited by examiner

POWER EXTENDER FOR SMART-HOME CONTROLLERS USING 2-WIRE COMMUNICATION

TECHNICAL FIELD

This patent specification relates to systems, methods, and related computer program products for powering controllers for energy-consuming systems or other resource-consuming systems. More particularly, this specification relates to an intermediate device, or power extender, between an environmental system and a controller that allows the controller to harvest power from the environmental system while simultaneously commanding the environmental system to perform an environmental function.

BACKGROUND

Early thermostats used a bimetallic strip to sense temperature and respond to temperature changes in the room. The movement of the bimetallic strip was used to directly open and close an electrical circuit. Power was delivered to an electromechanical actuator, usually relay or contactor in the HVAC equipment whenever the contact was closed to provide heating and/or cooling to the controlled space. Since these thermostats did not require electrical power to operate, the wiring connections were very simple. Only one wire connected to the transformer and another wire connected to the load. Typically, a 24 VAC power supply transformer, the thermostat, and 24 VAC HVAC equipment relay were all connected in a loop with each device having only two required external connections.

When electronics began to be used in thermostats, the fact that the thermostat was not directly wired to both sides of the transformer for its power source created a problem. This meant that the thermostat had to be hardwired directly from the system transformer. Direct hardwiring a common "C" wire from the transformer to the electronic thermostat may be very difficult and costly.

Because many households do not have a direct wire from the system transformer (such as a "C" wire), some thermostats have been designed to derive power from the transformer through the equipment load. The methods for powering an electronic thermostat from the transformer with a single direct wire connection to the transformer are called "power stealing" or "power sharing" methods. The thermostat "steals," "shares," or "harvests" its power during the "OFF" periods of the heating or cooling system by allowing a small amount of current to flow through it into the load coil below the load coil's response threshold (even at maximum transformer output voltage). During the "ON" periods of the heating or cooling system the thermostat draws power by allowing a small voltage drop across itself. Ideally, the voltage drop will not cause the load coil to dropout below its response threshold (even at minimum transformer output voltage).

The electronics involved in power stealing may be very complex. These electronics typically must interface between high-current, high-voltage HVAC systems and sensitive low-power electronics on the thermostat. Great care must be taken to prevent interference with the operation of the HVAC system to prevent user discomfort and/or inconvenience. Hence, improvements are needed that allow reliable power to be used from an environmental system to power a controller, even during active operation of the environmental system.

SUMMARY

In some embodiments, an intermediate device for powering a controller using power from an environmental system may include a plurality of wiring connectors including a power wire connector that may be configured to receive a power wire from the environmental system; a first command wire connector that may be configured to receive a first command wire from the environmental system, where the first command wire may be associated with a function of the environmental system; and a second command wire connector that may be configured to receive a second command wire from the controller, where the second command wire may be associated with the function of the environmental system. The intermediate device may also include a current monitor that may be configured to monitor current flowing between the power wire connector and the second command wire connector while the current is below a threshold indicative of an amount of current used to power the controller from the environmental system; and detect when the current flowing between the power wire connector and the second command wire connector exceeds the threshold indicating that the controller is sending a command to the environmental system to perform the function. The intermediate device may further include an output circuit that is configured to send the command to environmental system using the first command wire connector in response to detecting that the current flowing between the power wire connector and the first command wire connector exceeds the threshold.

In any embodiments, any and/or all of the following features may be implemented in any combination and without limitation. The plurality of wiring connectors may further include a first return wire connector from the environmental system, and a second return wire connector from the controller, where the intermediate device may connect the first return wire connector to the second return wire connector. Detecting when the current flowing between the power wire connector and the first command wire connector exceeds the threshold may indicate that the controller has caused a short between the second command wire connector from the controller and the second return wire connector from the controller. Sending the command to the environmental system using the first command wire connector may include causing a short between the first command wire connector and the first return wire connector from the environmental system. The second command wire connector may provide power that is harvested by the controller to power the controller and is used by the controller to activate the function of the environmental system. The plurality of wire connectors may include only three wire connectors to the environmental system and only two wire connectors to the controller. The environmental system may include a heating, ventilation, and air conditioning (HVAC) system, and the controller may include a smart-home device comprising a thermostat.

In some embodiments, a method of powering a controller using an intermediate device with power from an environmental system may include receiving, by the intermediate device, current from a power wire from the environmental system; and passing, by the intermediate device, the current from the power wire to a second command wire from the controller, where the second command wire may be associated with a function of the environmental system. The method may also include monitoring, by the intermediate device, the current flowing between the power wire and the second command wire while the current is below a threshold indicative of an amount of current used to power the controller from the environmental system. The method may additionally include detecting, by the intermediate device, when the current flowing between the power wire and the second command wire exceeds the threshold, indicating that the controller is sending a command to the environmental system to perform the function. The method may further include sending, by the intermediate device, the command to the environmental system using a first command wire from the environmental system in response to detecting that the current flowing between the power wire and the second command wire exceeds the threshold, where the first command wire may be associated with the function of the environmental system.

In any embodiments, any and/or all of the following features may be implemented in any combination and without limitation. Monitoring the current flowing between the power wire and the second command wire while the current is below the threshold may include measuring a voltage drop across a first resistance that is between the second command wire and the power wire. The method may also include switching the first resistance to a second resistance in response to detecting that the current flowing between the power wire and the second command wire exceeds the threshold. The first resistance may include approximately 10 ohms, and the second resistance may include approximately 900 ohms. Detecting when the current flowing between the power wire and the second command wire exceeds the threshold may include receiving a plurality of shorting pulses on the second command wire that are separated by a first time interval. The command to the environmental system may be continually maintained during the plurality of shorting pulses. Detecting when the current flowing between the power wire and the second command wire exceeds the threshold may include receiving a continuous shorting signal on the second command wire, and continually maintaining the command during the continuous shorting signal.

In some embodiments, a method of sending a command from a controller to an environmental system through an intermediate device may include receiving, by the controller, current from a command wire that runs between the controller and the intermediate device, where the current may be provided to the intermediate device from a power wire from the environmental system. The method may also include powering the controller using the current from the command wire. The method may additionally include determining, by the controller, that the environmental system should perform a function associated with the command wire. The method may further include sending, by the controller, a plurality of pulses to the intermediate device using the command wire during a time interval, where the intermediate device may cause the environmental system to continuously perform the function during the time interval, in response to receiving the plurality of pulses.

In any embodiments, any and/or all of the following features may be implemented in any combination and without limitation. Sending the plurality of pulses to the intermediate device may include repeatedly shorting the command wire to a return wire during the time interval. The method may also include testing to determine whether the intermediate device is present by sending a signal on the command wire. Sending the signal on the command wire may include shorting the command wire to a return wire. Testing to determine whether the intermediate device is present may include measuring the current through the command wire and determining whether the current is less than a threshold indicating that the intermediate device has increased a resistance through which the current flows. The plurality of pulses may occur approximately every 5 seconds. The plurality of pulses may be less than 10 ms wide.

DETAILED DESCRIPTION

A smart thermostat refers to a thermostat that can communicate via a network and allows a user to interact with the smart thermostat from a remote location, such as via a mobile device (e.g., smartphone, tablet computer, desktop computer, laptop computer, etc.). Additionally or alternatively, a smart thermostat has advanced features such as sensing as to whether any persons are in the vicinity of the smart thermostat and adjusting a setpoint temperature of the thermostat based on the sensed occupancy.

When a smart thermostat is installed, such as in a user's home, the user may desire that the smart thermostat be relatively easy to interact with and is also aesthetically pleasing. Embodiments detailed herein are directed to smart thermostats that can include a touch strip that is used by the user to provide input directly to the smart thermostat. In some embodiments, the touch strip is the only user interface present on the smart thermostat. Additionally, the user can interact with the thermostat via an application executed on a mobile device.

The smart thermostat may have a mirrored cover on a face of the thermostat. When the electronic display is turned off, the mirrored cover may have the visual effect of appearing to be a mirror to a user viewing the face of the thermostat. When the electronic display is illuminated, the mirrored cover has a sufficient transmissivity to allow the illuminated portion of the electronic display to be viewed by the user through the cover. In some embodiments, the cover does not have any cutouts, holes, lenses, or variations on the front surface that could be visible to the user.

The smart thermostat may have a radar sensor. The radar sensor may sense the ambient environment of the smart thermostat through the cover. The cover may use one or more ceramic oxide layers to achieve reflectivity rather than using any metallic layers. In some embodiments, no metallic layer is present within the cover. The lack of a metallic layer can help increase the transmissivity for electromagnetic radiation (or radio waves) emitted by the radar sensor and received by the radar sensor through the cover.

Figure 1:
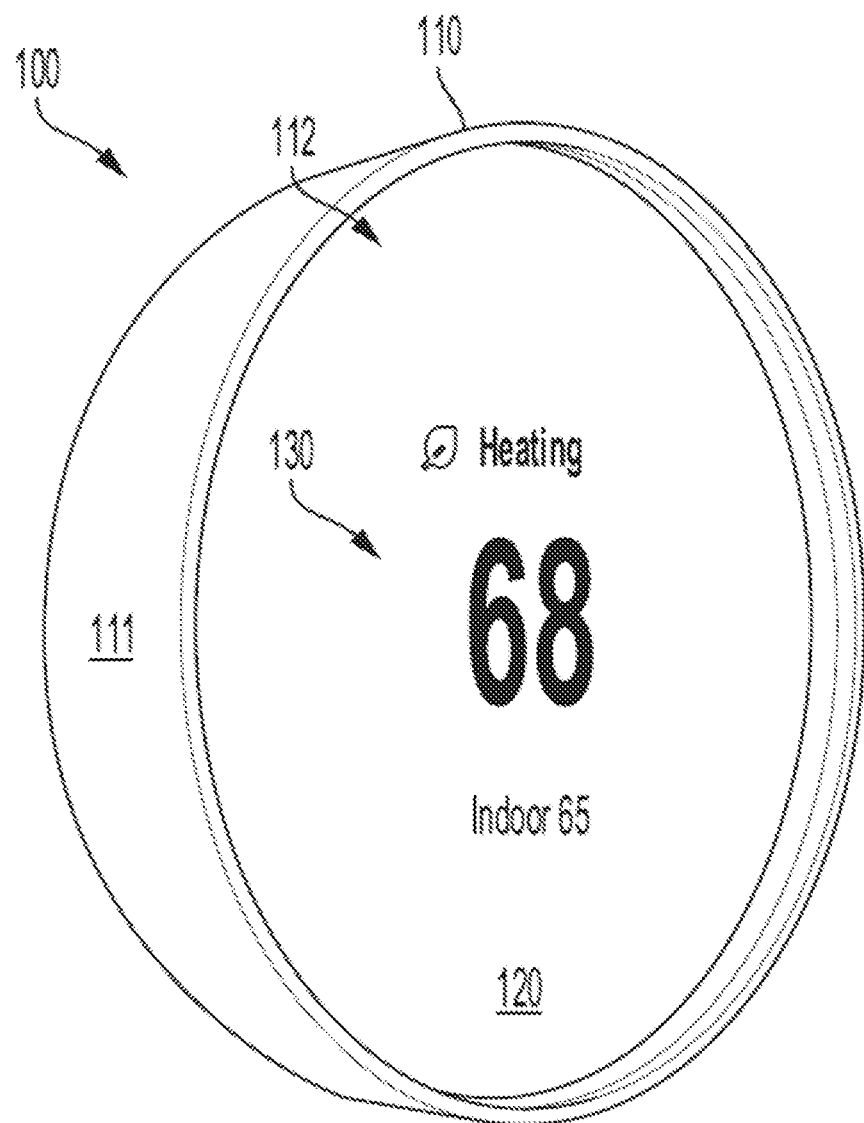
FIG. 1 illustrates a smart thermostat with an electronic display presenting information, according to some embodiments.

Further detail regarding the smart thermostat is provided in relation to the figures. FIG. 1 illustrates a smart thermostat 100 with an electronic display presenting information, according to some embodiments. As visible in FIG. 1, housing 110, cover 120, and a portion of an illuminated electronic display 130 ("display 130") can be seen.

Housing 110 defines rounded aperture 112, such as a circular aperture, in which cover 120 may be attached with housing 110. Housing 110 includes sidewall 111. In the illustrated embodiment, sidewall 111 is generally cylindrical. Around an axis perpendicular to cover 120, a radius of sidewall 111 may be greater at front of housing 110 where cover 120 is housed and smaller toward a back of housing 110.

Cover 120 is housed by housing 110 such that within aperture 112 cover 120 is visible when the front of smart thermostat 100 is viewed. Cover 120 can have a reflectivity such that when display 130 is not illuminated, cover 120 appears to be a mirror when viewed by a user.

Display 130 is housed behind cover 120 such that, when illuminated, the portion of display 130 that is illuminated is visible through cover 120 by a user. In some embodiments, due to the reflectivity of cover 120, an edge of display 130 is not visible to a user regardless of whether display 130 is illuminated, partially illuminated, or not illuminated. Therefore, the overall effect experienced by a user may be that cover 120 appears as a mirror and portions of display 130, when illuminated, are visible through cover 120.

In some embodiments, display 130 is not a touch screen. Therefore, in such embodiments, a user is required to use another user interface to interact with smart thermostat 100.

The user may use an application executed by a mobile device to interact with the thermostat via a wireless network or a direct wireless connection (e.g., Bluetooth). A user interface, such as a capacitive touch strip, may be present on smart thermostat 100. In some embodiments, the capacitive touch strip is the only user interface present on smart thermostat through which a user can interact with presented menus, icons, and other data presented on display 130. Further, in some embodiments, no user interface present on smart thermostat 100 has any moving parts. When smart thermostat 100 is fully installed, no components may be accessible or visible to the user that are movable.

Figure 2:
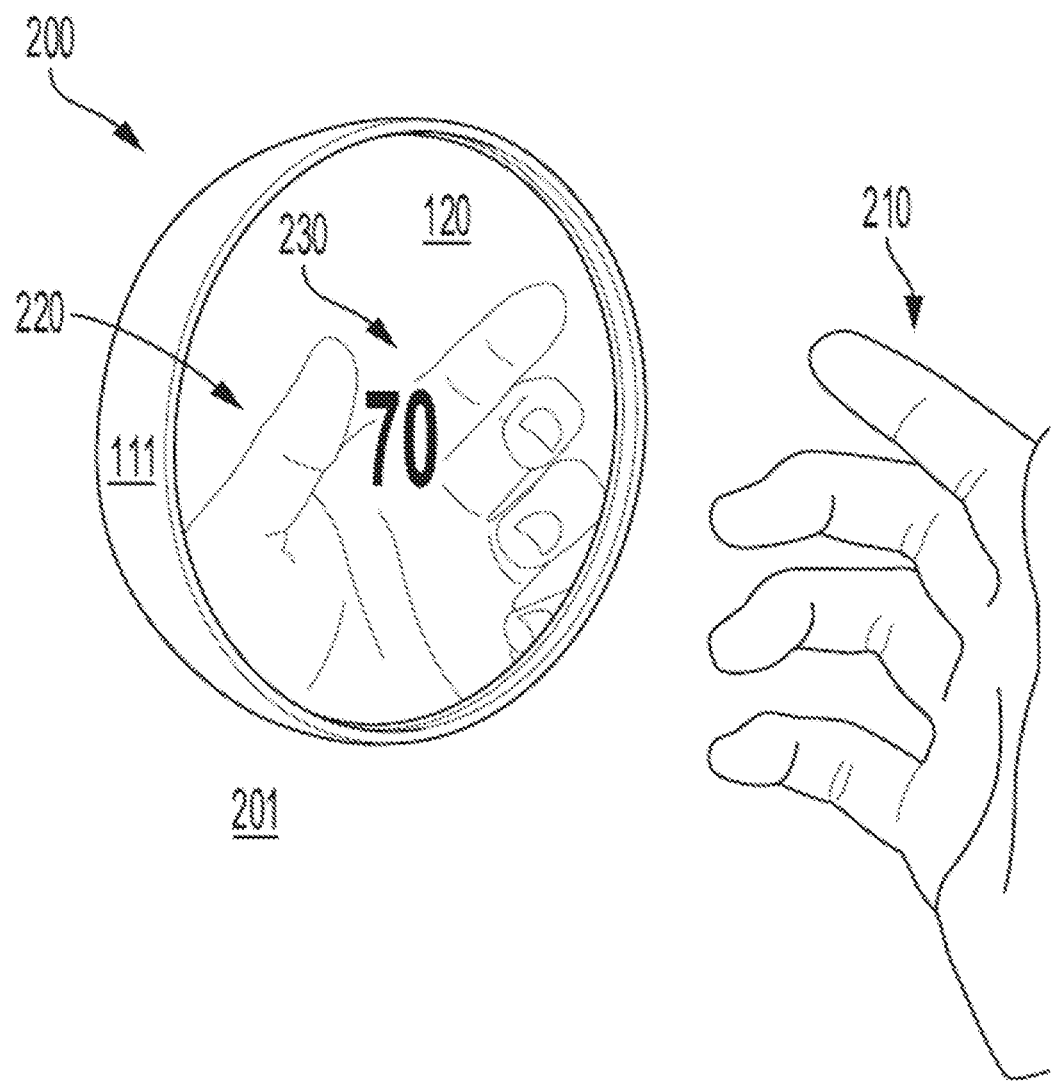
FIG. 2 illustrates a user's hand being present near thermostat that is mounted to a wall, according to some embodiments.

FIG. 2 illustrates a view 200 of a user's hand being present near thermostat 100 that is mounted to wall 201, according to some embodiments. In view 200, cover 120 is sufficiently reflective that a reflection 220 of user's hand 210 is visible. Cover 120 has a sufficient transmissivity that temperature 230, as presented by display 130 through cover 120, is also visible. To calculate transmittance, a perception weighted average can be used. In some embodiments, such as those in which cover 120 appears to have a "silver" tint, transmissivity may be 29%. For other colors, such as when cover 120 has a "rose" or "nickel" tint, transmissivity may be 22% and 18.6% respectively. In other embodiments, transmissivity may be between 15% and 55%. Reflectivity may be between 75% and 40% depending on embodiment.

As can be seen in embodiment 200, except for portions of display 130 that are illuminated, cover 120 appears as an uninterrupted surface with no gaps, holes, lens, or other discontinuities present on cover 120.

Figure 3A:
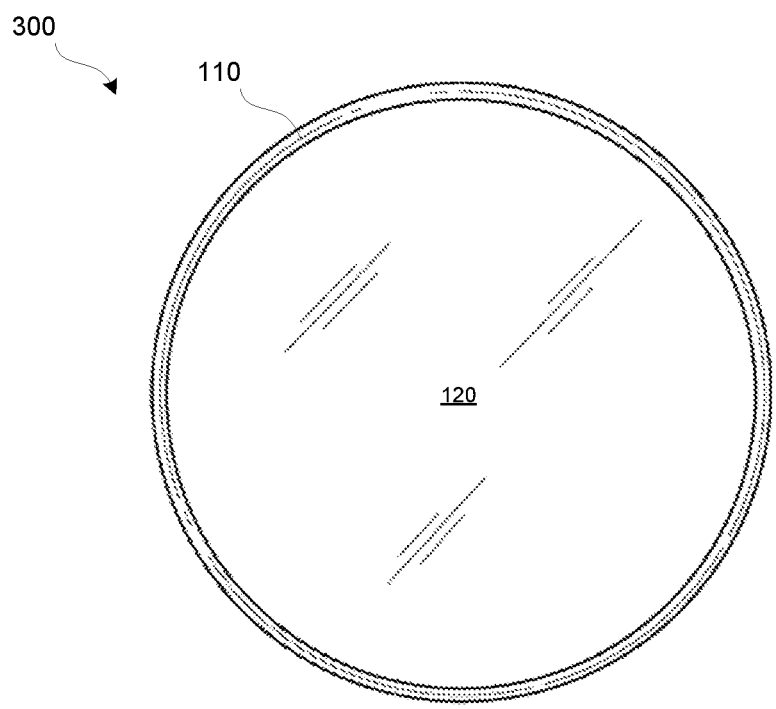
FIG. 3A-3B illustrates a smart thermostat as viewed from the front and the right, according to some embodiments.

FIG. 3A illustrates a smart thermostat 300 as viewed from the front, according to some embodiments. When mounted on a wall or other surface, cover 120 is opposite the portion of thermostat 300 that mounts to the wall or other surface. Therefore, when a user is facing mounted thermostat 300, cover 120 is visible.

Smart thermostat 300 can represent an embodiment of thermostat 100 of FIGS. 1 and 2. Housing 110 can define a rounded aperture in which cover 120 is located. In some embodiments, housing 110 defines a circular aperture in which cover 120 is located. In such embodiments, cover 120 can be circular. As previously detailed, cover 120 can form an uninterrupted surface with no gaps, holes, lens, or other discontinuities present on cover 120. Cover 120 has sufficient transmissivity to allow light emitted by electronic display 130 located within housing 110 to be visible through cover 120. Cover 120 can have sufficient reflectivity such that a mirrored effect is present on portions of cover 120 that are not currently being illuminated from behind by electronic display 130. Notably, in some embodiments, it is not possible for a user to view where an edge of electronic display 130 is through cover 120 due to the reflectivity of cover 120.

Figure 3B:
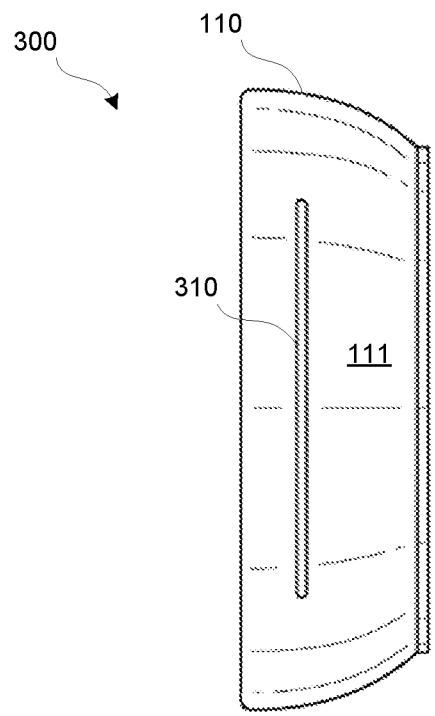

FIG. 3B illustrates a smart thermostat 300 as viewed from the right, according to some embodiments. Thermostat 300 can represent thermostat 100 of FIG. 1. When thermostat 300 is mounted to a wall or other surface, touch strip indicator 310 may be visible on the right side of sidewall 111. Touch strip indicator 310 may be a visible indicator, such as a line, shading, or some form of shape or marking that serves as a visible indicator as to where a user can touch sidewall 111 to provide user input. Within housing 110, on an inner side of the sidewall opposite touch strip indicator 310, can be a touch strip that can detect one or more types of gestures performed by a user on or near touch strip indicator 310. For example, a user can perform a tap gesture (touch and release), a swipe gesture (e.g., swipe upward along touch strip indicator 310, swipe downward along touch strip indicator 310), or a long hold gesture (touch and hold for at least a threshold amount of time).

The touch strip may be capacitive and, through sidewall 111 of housing 110, a user's touch against sidewall 111 can be detected. Touch strip indicator 310 may serve to indicate to a user the region in which the user's touch is sensed. Any gesture performed significantly away from touch strip indicator 310 may be unlikely to be sensed by the touch strip. The touch strip located within housing 110 may represent the only user input component present on thermostat 300 through which a user can directly provide input to thermostat 300. Additionally, a user may use an application or website executed on another computerized device to interact with thermostat 300.

The tactile sensation when a user moves his finger over touch strip indicator 310 might be no different than sidewall 111. Alternatively, touch strip indicator 310 may have a variance in protrusion or texture from sidewall 111 so that a user can determine the location of touch strip indicator 310 by touch. For instance, a multi-layer (e.g., 4 layer) pad print may be performed to create touch strip indicator 310 such that a subtle protrusion of touch strip indicator 310 is present. Such an arrangement may be beneficial when interacting with thermostat 300 in a darkened environment.

In the embodiment of thermostat 300, touch strip indicator 310 and the corresponding touch strip are located on a right side of thermostat 300 when viewed from the front (such as seen in FIG. 3). In other embodiments, the touch strip and corresponding touch strip indicator 310 may be present on a top, bottom, or left of sidewall 111. In some embodiments, multiple touch strips may be present, such as on the left and right of sidewall 111.

Figure 4:
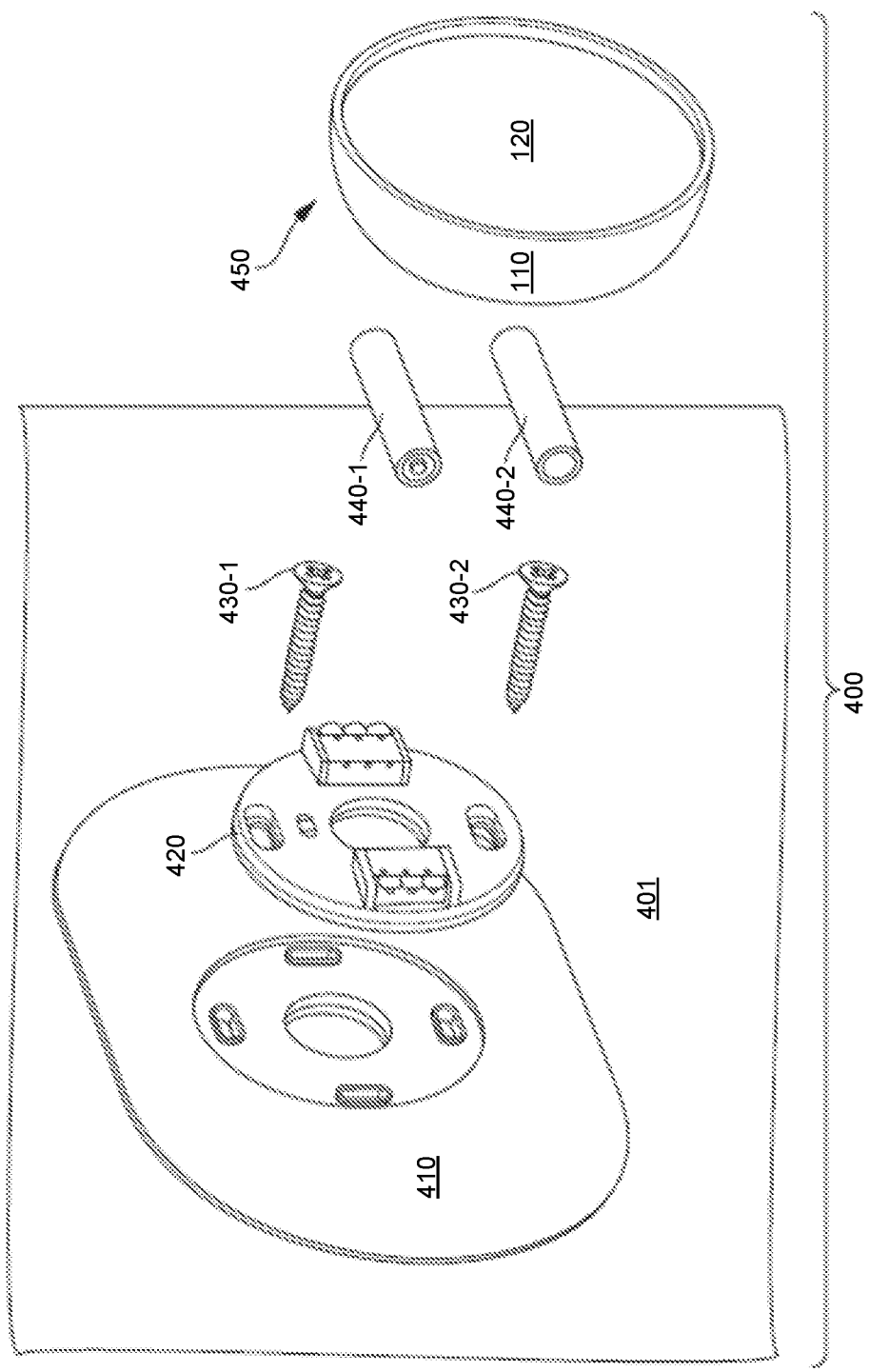
FIG. 4 illustrates a thermostat mounting system, according to some embodiments.

FIG. 4 illustrates a thermostat mounting system 400, according to some embodiments. Thermostat mounting system 400 can include: trim plate 410; backplate 420; fasteners 430; batteries 440; and thermostat 450. Thermostat 450 can represent an embodiment of thermostat 100 of FIG. 1 and the other thermostat embodiments detailed herein. Trim plate 410 may be plastic, wooden, or metallic plate that defines several holes to accommodate fasteners 430 and allow HVAC (heating, ventilation, and air conditioning) control wires to pass through. Trim plate 410 may serve to conceal any unsightly holes present in wall 401, such as where previous drilling occurred, electrical boxes, paint mismatches, or other aesthetic variances.

Backplate 420 may include multiple receptacles, with each receptacle designated to receive a particular HVAC control wire. Backplate 420 can define one or more holes configured to receive fasteners 430. Fasteners 430 can secure backplate 420 and, if being used, trim plate 410, to a surface, such as a wall.

In some embodiments, two fasteners, fastener 430-1 and fastener 430-2 may be presented. Fasteners 430 may be screws, nails, or some other form of fastener. Fasteners 430 can securely hold backplate 420 and, possibly, trim plate 410 to a surface, such as a wall. Thermostat 450 may removably attach with backplate 420. A user may be able to attach thermostat 450 to backplate 420 by pushing thermostat 450 against backplate 420. Similarly, a user can remove thermostat 450 from backplate 420 by pulling thermostat 450 away from backplate 420. When thermostat 450 is connected with backplate 420, electrical connections between thermostat 450 and HVAC control wires that have been connected with the receptacles of backplate 420.

In some embodiments, HVAC control wires can include a "C" wire, which stands for common wire. The C wire delivers power, such as in the form of 24 V AC, to thermostat 450. Thermostat 450, being connected with a C wire (and, possibly an "R" wire, which is typically red), can have access to a power supply that does not need to be periodically replaced or recharged, such as batteries 440. In some embodiments, if a C wire is not present, thermostat 450 can function using batteries 440 as its exclusive power source.

Batteries 440, which can include one or more batteries, such as battery 440-1 and battery 440-2, can serve as a primary power source or as a backup power source. In some embodiments, one or more features of thermostat 450 can be disabled if only batteries 440 are available as a power supply. Batteries 440 may be replaceable by a user. Batteries 440 may be rechargeable.

Figure 5:
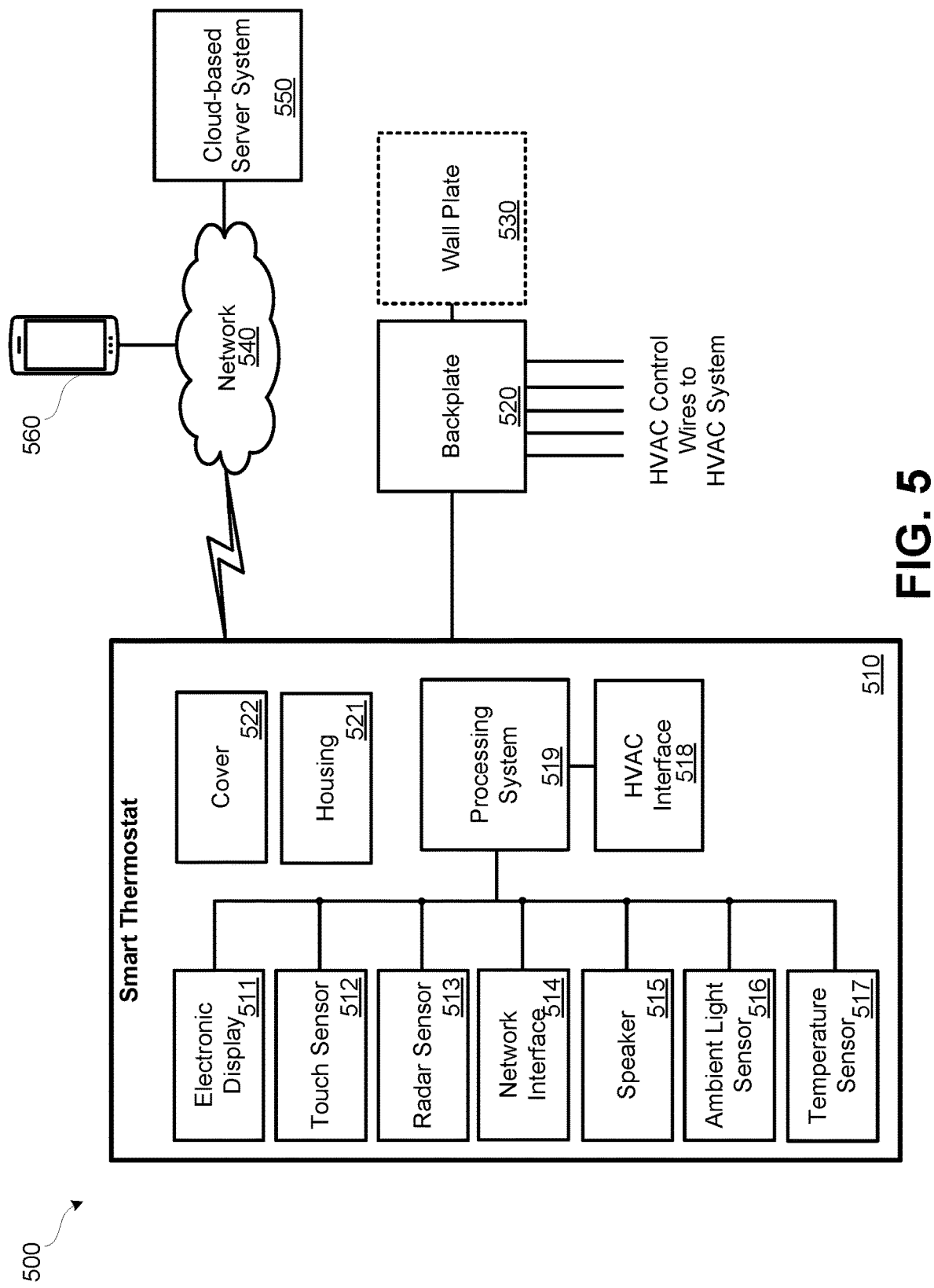
FIG. 5 illustrates a smart thermostat system, according to some embodiments.

FIG. 5 illustrates a smart thermostat system 500, according to some embodiments. Smart thermostat system 500 can include smart thermostat 510; backplate 520; trim plate 530; network 540; cloud-based server system 550; and computerized device 560. Smart thermostat 510 can represent any of the thermostats detailed in relation to FIGS. 1-4. Thermostat 510 can include: electronic display 511; touch sensor 512; radar sensor 513; network interface 514; speaker 515; ambient light sensor 516; temperature sensor 517; HVAC interface 518; processing system 519; housing 521; and cover 522.

Electronic display 511 may be visible through cover 522. In some embodiments, electronic display 511 is only visible when electronic display 511 is illuminated. In some embodiments, electronic display 511 is not a touch screen. Touch sensor 512 may allow one or more gestures, including tap and swipe gestures, to be detected. Touch sensor 512 may be a capacitive sensor that includes multiple electrodes. In some embodiments, touch sensor 512 is a touch strip that includes five or more electrodes.

Radar sensor 513 may be configured to output radio waves into the ambient environment in front of electronic display 511 of thermostat 510. Radar sensor 513 may be an integrated circuit that includes one or more antennas, one or more RF emitters, and one or more RF receivers. Radar sensor 513 may be able to detect the presence of a user and the distance at which the user is located. Radar sensor 513 may use frequency-modulated continuous wave (FMCW) radar. Radar sensor 513 may emit radio waves and receive reflected radio waves through cover 522. Radar sensor 513 may emit chirps of radar that sweep from a first frequency to a second frequency. Therefore, the waveform output by radar sensor 513 may be a saw tooth waveform. Using receive-side beam steering on the reflected radio waves received using multiple antennas, certain regions may be targeted for sensing the presence of users. For instance, beam steering away from the ground may be performed to avoid pets being potentially incorrectly detected as a user.

Network interface 514 may be used to communicate with one or more wired or wireless networks. Network interface 514 may communicate with a wireless local area network, such as a WiFi network. Additional or alternative network interfaces may also be present. For example, thermostat 510 may be able to communicate with a user device directly, such as using Bluetooth. Thermostat 510 may be able to communicate via a mesh network with various other home automation devices. Mesh networks may use relatively less power compared to wireless local area network-based communication, such as WiFi. In some embodiments, thermostat 510 can serve as an edge router that translates communications between a mesh network and a wireless network, such as a WiFi network. In some embodiments, a wired network interface may be present, such as to allow communication with a local area network (LAN). One or more direct wireless communication interfaces may also be present, such as to enable direct communication with a remote temperature sensor installed in a different housing external and distinct from housing 521. The evolution of wireless communication to fifth generation (5G) and sixth generation (6G) standards and technologies provides greater throughput with lower latency which enhances mobile broadband services. 5G and 6G technologies also provide new classes of services, over control and data channels, for vehicular networking (V2X), fixed wireless broadband, and the Internet of Things (IoT). Thermostat 510 may include one or more wireless interfaces that can communicate using 5G and/or 6G networks.

Speaker 515 can be used to output audio. Speaker 515 may be used to output beeps, clicks, or other audible sounds, such as in response to the detection of user input via touch sensor 512.

Ambient light sensor 516 may sense the amount of light present in the environment of thermostat 510. Measurements made by ambient light sensor 516 may be used to adjust the brightness of electronic display 511. In some embodiments, ambient light sensor 516 senses an amount of ambient light through cover 522. Therefore, compensation for the reflectivity of cover 522 may be made such that the ambient light levels are correctly determined via ambient light sensor 516. A light pipe may be present between ambient light sensor 516 and cover 522 such that in a particular region of cover 522, light that is transmitted through cover 522, is directed to ambient light sensor 516, which may be mounted to a printed circuit board (PCB), such as a PCB to which processing system 519 is attached.

One or more temperature sensors, such as temperature sensor 517, may be present within thermostat 510. Temperature sensor 517 may be used to measure the ambient temperature in the environment of thermostat 510. One or more additional temperature sensors that are remote from thermostat 510 may additionally or alternatively be used to measure the temperature of the ambient environment.

Cover 522 may have a transmissivity sufficient to allow illuminated portions of electronic display 511 to be viewed through cover 522 from an exterior of thermostat 510 by a user. Cover 522 may have a reflectivity sufficient such that portions of cover 522 that are not illuminated from behind appear to have a mirrored effect to a user viewing a front of thermostat 510.

HVAC interface 518 can include one or more interfaces that control whether a circuit involving various HVAC control wires that are connected either directly with thermostat 510 or with backplate 520 is completed. A heating system (e.g., furnace, heat pump), cooling system (e.g., air conditioner), and/or fan may be controlled via HVAC wires by opening and closing circuits that include the HVAC control wires.

Processing system 519 can include one or more processors. Processing system 519 may include one or more special-purpose or general-purpose processors. Such special-purpose processors may include processors that are specifically designed to perform the functions detailed herein. Such special-purpose processors may be ASICs or FPGAs which are general-purpose components that are physically and electrically configured to perform the functions detailed herein. Such general-purpose processors may execute special-purpose software that is stored using one or more non-transitory processor-readable mediums, such as random access memory (RAM), flash memory, a hard disk drive (HDD), or a solid state drive (SSD) of thermostat 510.

Processing system 519 may output information for presentation to electronic display 511. Processing system 519 can receive information from touch sensor 512, radar sensor 513, and ambient light sensor 516. Processing system 519 can perform bidirectional communication with network interface 514. Processing system 519 can output information to be output as sound to speaker 515. Processing system 519 can control the HVAC system via HVAC interface 518.

Housing 521 may house all of the components of thermostat 510. Touch sensor 512 may be interacted with a user through housing 521. Housing 521 may define a sidewall and an aperture, such as a rounded aperture (e.g., a circular aperture) in which cover 522 is present.

Thermostat 510 may be attached (and removed) from backplate 520. HVAC control wires may be attached with terminals or receptacles of backplate 520. Alternatively, such control wires may be directly connected with thermostat 510. In some embodiments, trim plate 530 may additionally be installed between backplate 520 and a surface, such as a wall, such as for aesthetic reasons (e.g., cover an unsightly hole through which HVAC wires protrude from the wall.

Network 540 can include one or more wireless networks, wired networks, public networks, private networks, and/or mesh networks. A home wireless local area network (e.g., a Wi-Fi network) may be part of network 540. Network 540 can include the Internet. Network 540 can include a mesh network, which may include one or more other smart home devices, may be used to enable thermostat 510 to communicate with another network, such as a Wi-Fi network. Thermostat 510 may function as an edge router that translates communications from a relatively low power mesh network received from other devices to another form of network, such as a relatively higher power network, such as a Wi-Fi network.

Cloud-based server system 550 can maintain an account mapped to smart thermostat 510. Thermostat 510 may periodically or intermittently communicate with cloud-based server system 550 to determine whether setpoint or schedule changes have been made. A user may interact with thermostat 510 via computerized device 560, which may be a mobile device, smartphone, tablet computer, laptop computer, desktop computer, or some other form of computerized device that can communicate with cloud-based server system 550 via network 540 or can communicate directly with thermostat 510 (e.g., via Bluetooth or some other device-to-device communication protocol). A user can interact with an application executed on computerized device 560 to control or interact with thermostat 510.

Power Extender Intermediate Device

Many smart-home systems include environmental systems or energy-consuming systems that are controlled by a controller. An environmental system may include an HVAC system, a smart appliance, a doorbell, a pool heater, a security system hub, and/or any other system that may respond to a separate controller and which may provide and/or consume energy during its operation. As used herein, the terms environmental system and energy-consuming system may be used interchangeably. A controller may include any smart-home device that controls the operation of an environmental system or energy-consuming system. Examples of controllers may include a thermostat, a doorbell button, a security system sensor (e.g., a camera, a switch, a motion sensor, etc.), a heater control, and/or any other electronic device that may provide commands to an environmental system to perform a specific function. Some controllers may be in wireless communication with the corresponding environmental system, such as a smart phone communicating with an environmental system. Other controllers may be in wired communication with the corresponding environmental system. When a controller has a wired connection to the corresponding environmental system, the controller may provide commands over the wired interface, and in some embodiments, the controller may also use power from the environmental system that is harvested over the wired interface. Often, the purpose of the wired interface from the perspective of the environmental system is simply to provide a communication link. Therefore, when a controller also uses power from the wired interface, this power usage may be referred to as power stealing, power harvesting, or other similar terms.

In this disclosure, a thermostat may be used as an example of a controller that uses a wired communication channel to control a corresponding environmental system, such as an HVAC system. However, a thermostat and an HVAC system are provided only by way of example and are not meant to be limiting when interpreting the terms "controller" and "environmental system." This disclosure includes a description of a smart-home environment, as well as many smart-home devices that may be paired with environmental systems within the smart-home environment. Therefore, the terms "controller" and "environmental system" may be construed to include any smart-home device and any environmental system in the smart-home environment unless specifically stated otherwise. The specific circuits and/or algorithms described herein for a thermostat and HVAC system may be broadly applied in a similar manner to other controllers and environmental systems.

Figure 6:
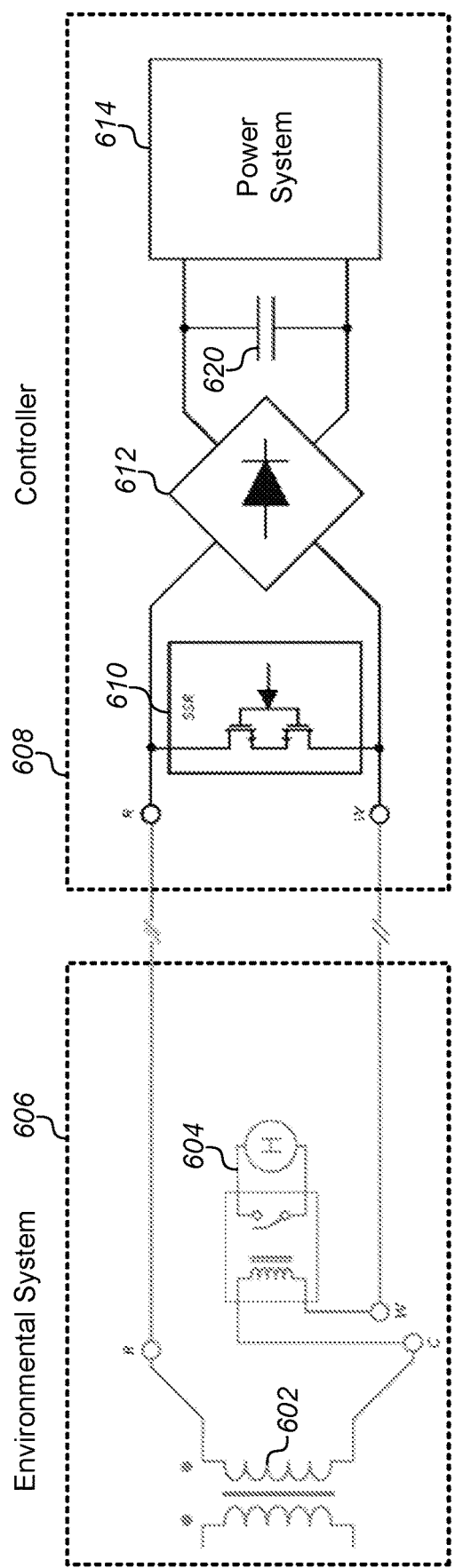
FIG. 6 illustrates an example of an environmental system communicating with a controller through a wired communication channel, according to some embodiments.

FIG. 6 illustrates an example of an environmental system 606 communicating with a controller 608 through a wired communication channel, according to some embodiments. The environmental system 606 may include a trigger circuit 604 that includes a command relay that activates an electrical system 602 to perform a specific function. For example, an HVAC system may include a trigger circuit 604 that may be switched to activate the electrical system 602 to perform a heating function, an air conditioning function, a fan function, and so forth. The trigger circuit 604 may be associated with what is referred to herein as a "command wire" that is provided as an output of the environment system 606. A command wire may include any wire that may be used to provide a command from the controller 608 to the environmental system 606. For example, an HVAC system may include a W wire (heating) and/or a Y wire (cooling). These command wires may also be referred to as call relay wires or call wires, and they may be associated with one or more R wires (return wires). To activate a function, the controller 608 may connect to the command wire to the corresponding return wire, thereby causing current to flow from the command wire to the return wire in the environmental system 606. This may activate a trigger circuit 604 to engage the corresponding function of the environment system 606. For example, shorting the W wire to the R wire in the controller 608 using a switch 610 may cause the environmental system 606 to perform a heating function.

In some embodiments, the controller 608 may use the power provided through one of the command wires to harvest power from the environmental system 606 for powering the controller 608. At a basic level, the controller 608 may take advantage of a voltage differential between the command wire and the return wire when they are not shorted together to charge a storage capacitor, recharge a battery, provide power to a power converter, and/or perform other functions that provide power to the controller 608. For example, an environment of system 606 such as an HVAC system may provide a 24 VAC signal through the W wire to the controller 608 such as a thermostat. When the switch 610 is not closed, a voltage differential may exist between the command wire in the return wire, and this voltage may be provided to, for example, a diode bridge 612 that produces an output DC signal. The DC signal may be used to charge an energy-storage element 620, such as a capacitor or a rechargeable battery. The charge on the energy-storage element 620 may be provided to a power system 614 of the controller 608 to provide system power to the controller 608. The power system 614 may include one or more power converters that generate power rails at various voltages and provide stable currents to different subsystems within the controller 608. When the controller 608 is actively calling for the function performed by the environmental system 606, the switch 610 may be closed. So-called "active power harvesting" may temporarily open the switch 610 to charge the energy-storage element 620 and close the switch 610 again before the function of the environment system 606 is interrupted.

Power harvesting is useful because many environmental systems may not provide a wired connection to a separate power wire to the location where the controller 608 is installed. For example, early thermostats were constructed using mechanical devices or simple electronics that did not require a separate power source on which to run. Therefore, up to 60% of current HVAC installations only have 2-wire interfaces between the HVAC system and the thermostat (e.g. W and R wires). As used herein, the term "2-wire" may refer to the communication protocol described above comprising a command wire and return wire where the controller calls for the environment system to perform a function by connecting the command wire to the return wire. However, a 2-wire communication does not imply that only two wires run between the controller 608 and the environment system 606. In fact, multiple command wires paired with individual or shared return wires may run between the environment system 606 and the controller 608 in 2-wire communication pairs. When thermostats did not require power and 2-wire communication was sufficient, these installations did not include a separate power wire or "C wire" running between the environment system 606 and the controller 608 to specifically power the controller 608. Thus, a 2-wire system typically will not include a separate power wire.

Modern "smart" thermostats, such as the Nest® Learning Thermostat™ include advanced functionality, such as active displays, wireless communication, advanced algorithms, microprocessors, user interfaces, and so forth, that may require much more power than previous generations of programmable thermostats. Therefore, these advanced thermostats tend to be best suited for a continuous, wired power source through a power wire directly from a transformer of the environment system, such as through a C wire. When a separate power wire is provided, the current can be provided uninterrupted through the bridge 612 to continuously charge the energy-storage element 620. However, when a separate power wire is not provided in the through-the-wall bundle of wires from the environment system 606 to the controller 608, then the controller will typically rely on the passive/active power harvesting through the command wire(s) as described above.

However, relying on power harvesting to power a controller does have some drawbacks. For example, the controller 608 may need to limit the amount of power it harvests from the control circuit to avoid activating the channel that the circuit controls. Thus, even during inactive power harvesting, there is a limit on the amount of power that may be extracted from the environmental system 606. Additionally, active power harvesting requires careful modulation of the switching circuit in the controller 608 to avoid interrupting the function of the environmental system 606. For sensitive systems (e.g., high impedance systems), power harvesting through command wires simply may not work at all.

Modifying existing installations to add a C wire typically requires hiring an HVAC professional, which represents a significant expense and inconvenience to the user. Some solutions have been developed that are referred to as "add-a-wire" devices. These solutions typically multiplex control for two HVAC channels onto a single wire, then repurpose the spare wire to provide power to the controller 608. However, this approach does not work for HVAC systems with only two wires. For example, some HVAC systems may only provide heating or cooling rather than providing both functions, particularly in older homes, so multiplexing multiple command wires may not be available. Additionally, add-a-wire solutions require a dedicated terminal or an additional diode. The solutions are not backwards compatible with previous thermostat versions and typically do not work with a secondary transformer.

Figure 7:
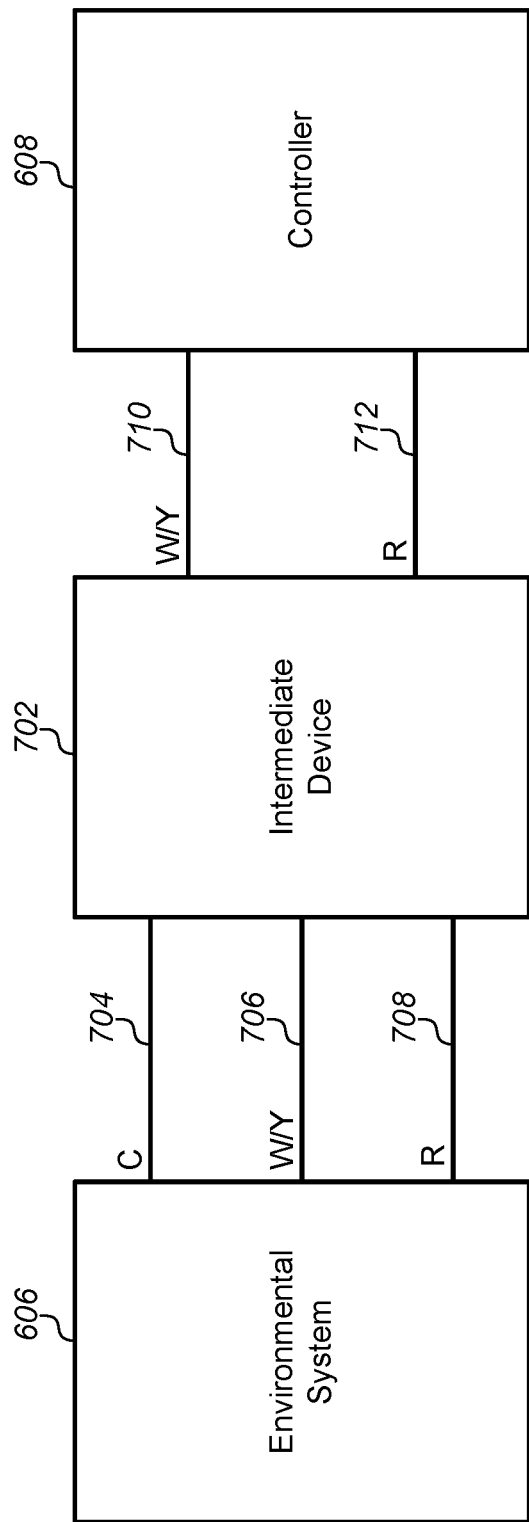
FIG. 7 illustrates an intermediate device that may be wired between the environmental system and the controller, according to some embodiments.

FIG. 7 illustrates an architecture with an intermediate device 702 that may be wired between the environmental system 606 and the controller 608, according to some embodiments. In contrast to existing add-a-wire systems, this intermediate device 702 may operate with two wires for any function connection to the controller 608. The intermediate device 702 may include a plurality of wire connectors that are configured to receive various wires from the environmental system 606 and the controller 608. For example, the wire connectors may include a power wire connector that is configured to receive a power wire 704 from the environmental system 606. The power wire 704 may be configured to provide power from the environmental system 606 to the controller 608. For example, a C wire may be configured to provide a 24 VAC signal from the environmental system 606 to the controller 608. The wire connectors on the intermediate device 702 may also include a first command wire connector that is configured to receive a first command wire 706 from the environmental system. The first command wire 706 may be associated with a particular function of the environmental system 606 such as a W wire or a Y wire from an HVAC system. Some embodiments may also include a first return wire connector configured to receive a first return wire 708 to the environmental system 606, such as an R wire associated with the W wire or the Y wire of an HVAC system. The particular function may include a cooling function, a heating function, a fan function, and auxiliary heat function, and/or any other environmental system function.

In addition to the wiring connectors to the environmental system 606, the intermediate device 702 may also include wire connectors configured to receive wires from the controller 608. For example, the wire connectors may include a second command wire connector that is configured to receive a second command wire 710 from the controller 608. The second command wire 710 may be associated with the same function of the environmental system as the first command wire 706 (e.g., a heating function on a W wire). Some embodiments may also include a second return wire connector configured to receive a second return wire 712 from the controller 608. As described below, the first return wire 708 may be connected to the second return wire 712 in the intermediate device 702.

The intermediate device 702 may use the power wire 704 to provide continuous power to the controller 708 through the wire connector for the second command wire 710. This may present a low impedance path between an equipment transformer in the environmental system 606 and the controller 608, thus allowing the controller 608 to harvest power from the environmental system 606 through the wire connector for the second command wire 710. The controller 608 may also close a switch between the second command wire 710 and the second return wire 712 to call for the associated function of the environmental system 606. The intermediate device 702 may detect the short between the second command wire 710 and the second return wire 712 and provide a corresponding short between the first command wire 706 and the first return wire 708. For example, the controller 608 may close a switch between a W wire and an R wire. The intermediate device 702 may detect this short and close a corresponding switch between the W wire and the R wire to the environmental system 606. Instead of requiring this switch in the controller 608 to remain closed to maintain the function at the environmental system 606, the controller 608 may instead pulse the switch at a very low duty cycle, which allows the controller 608 to continuously harvest power from the environmental system 606 using the open voltage differential between the wire connectors for the second command wire 710 and the second return wire 712. In essence, this reverses the normal power harvesting paradigm where the switch at the controller 608 stays closed the majority of the time and only opens briefly to charge an energy-storage element.

Figure 8B:
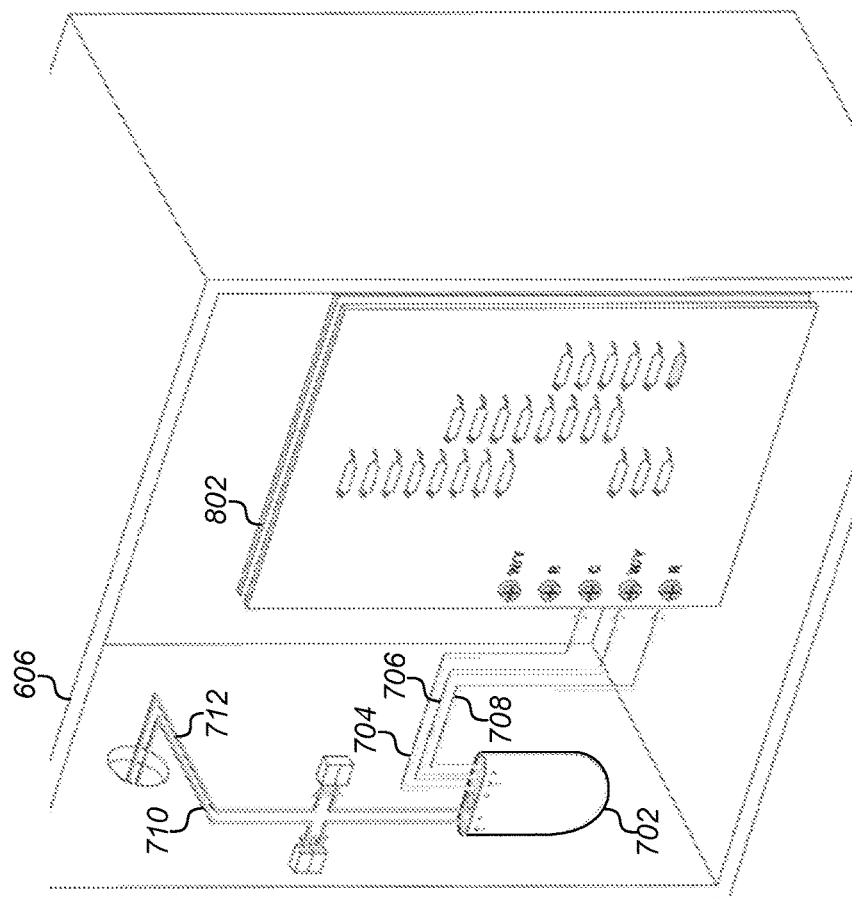
FIG. 8B illustrates an example of the intermediate device as it may be installed at the environmental system, according to some embodiments.
Figure 8A:
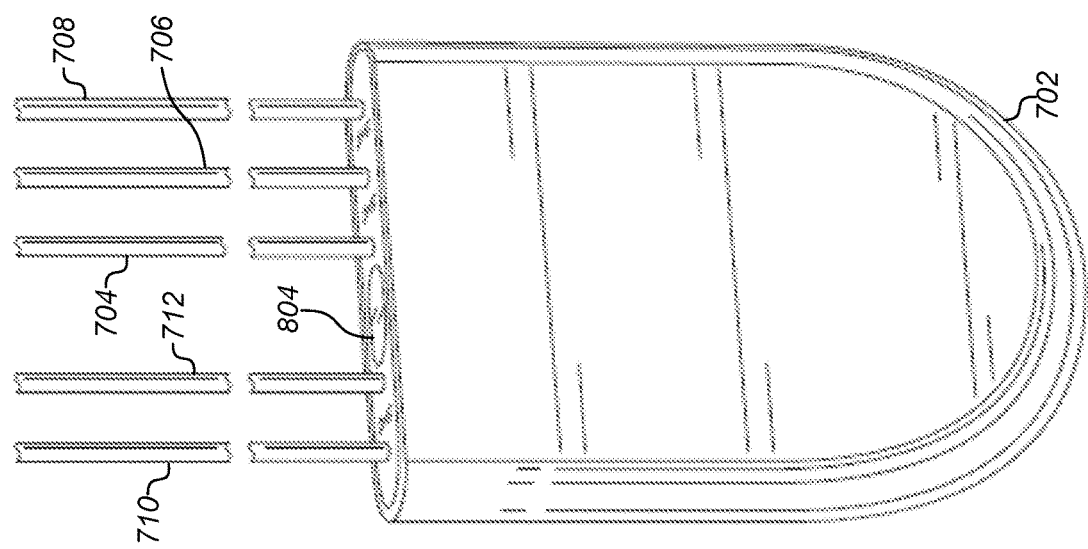
FIG. 8A illustrates an example of a physical implementation of the intermediate device, according to some embodiments.

FIG. 8A illustrates an example of a physical implementation of the intermediate device 702, according to some embodiments. The intermediate device 702 may include a housing and an optional user interface. The user interface may include an LED or other display that indicates when power is provided to the intermediate device 702. The intermediate device 702 may include a housing as illustrated in FIG. 8A, and the housing may enclose the internal electronics of the intermediate device 702.

The intermediate device 702 may also include the plurality of wiring connectors on a side of the intermediate device 702. In some embodiments, the wiring connectors may include connectors that allow wires to be inserted into the wiring connectors. For example, the wiring connectors may include a clamp or hole into which a stripped end of a wire may be inserted. In other embodiments, the wiring connectors may include a wire stub that extends out of the intermediate device 702. These wires may then be connected to wires from the environmental system 606 and/or the controller 608 using junction boxes, pigtail connectors, twist-on wire connectors, and/or other connection methods that may be used to join two electrical wires. In some embodiments, the wiring connectors may include wires that extend out of the intermediate device 702 that may be connected directly to an electrical interface for the environmental system 606. Therefore, the term "wire connector" should be interpreted broadly to encompass insertion-type wire connectors as well as wire stubs that extend out of the intermediate device 702 that are configured to be connected to wires and/or electrical connectors from the environment of system 606 and/or the controller 608.

In some embodiments, the plurality of wiring connectors may be arranged on the intermediate device 702 such that the 2-wire connection between the intermediate device 702 and the controller 608 can be readily distinguished from the 3-wire connection between the intermediate device 702 and the environment system 606. For example, FIG. 8A illustrates how the connectors for the second command wire 710 and the second return wire 712 from the controller 608 may be grouped together and separated from the wiring connectors for the first command wire 706, the first return wire 708, and the power wire 704. These wire groupings may be visibly separated by a button or user interface 804 on the intermediate device 702. Corresponding labels may also be included on the intermediate device 702 (e.g., "HVAC C wire," "Thermostat W/Y wire") for each of the wiring connectors.

FIG. 8B illustrates an example of the intermediate device 702 as it may be installed at the environmental system 606, according to some embodiments. The intermediate device 702 may be installed inside or outside of a housing for the environmental system 606. The first command wire 706, the first return wire 708, and the power wire 704 may be connected directly to electrical terminals on electrical panel 802 of the environmental system 606. Thus, even if a power wire is not routed from the environmental system 606 through the wall to the controller 608, a connection to a power terminal on the electrical panel 802 may be provided to the intermediate device 702.

When the environmental system 606 is installed in a building, control wires from the environmental system 606 will typically be routed through the walls of the building to a location of the controller. For example, wires from the HVAC system (e.g., in the basement) will typically be routed through the walls of a home to a location where the thermostat will typically be installed (e.g., in a hallway on a main floor). Therefore, when installing the intermediate device 702, the wires running between the environmental system 606 on the controller 608 may already be established in place. Instead of requiring a professional installer to route another wire for the power wire from the environmental system 606 to the controller 608, the intermediate device 702 may receive the 2-wire connection that already runs through the walls that includes the second command wire 710 and the second return wire 712. As described below, the intermediate device 702 may use the second command wire 710 to both provide power to the controller 608 and to receive commands from the controller 608.

Figure 9:
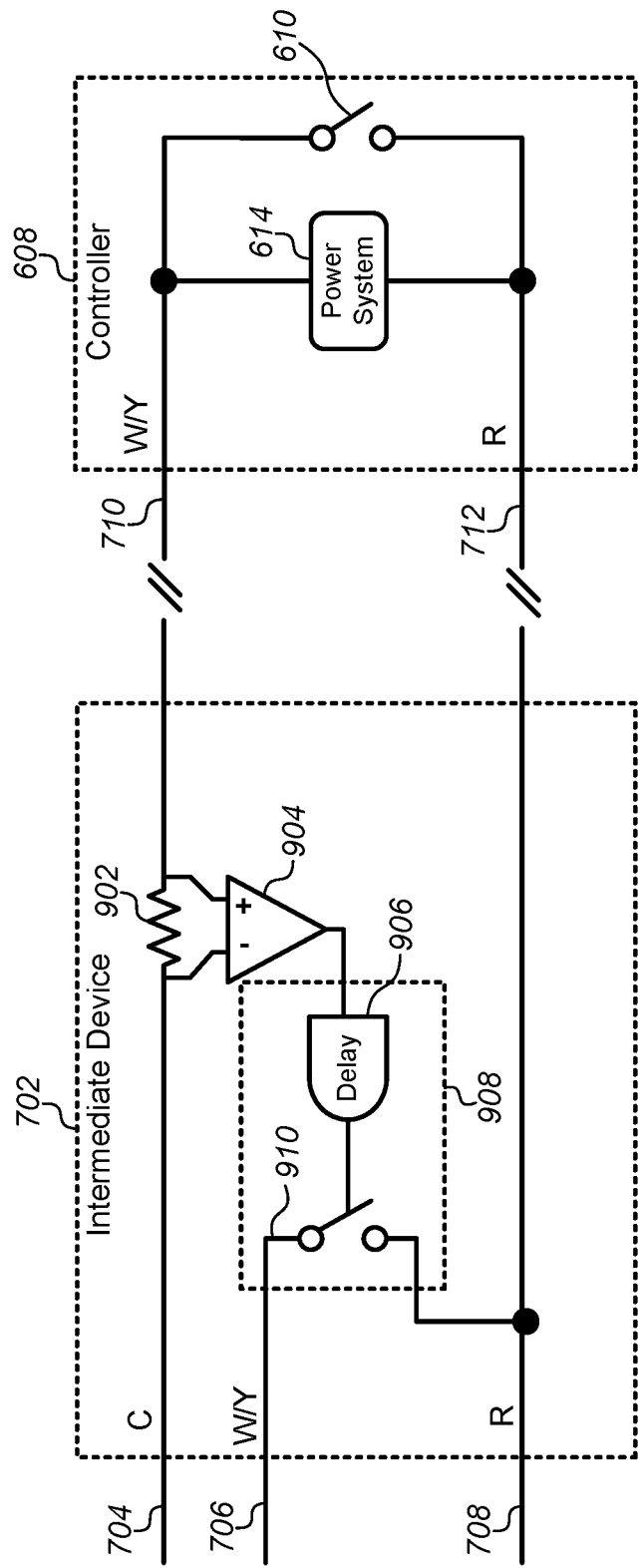
FIG. 9 illustrates a simplified block diagram of the internal systems of the intermediate device, according to some embodiments.

FIG. 9 illustrates a simplified block diagram of the internal systems of the intermediate device 702, according to some embodiments. The power wire 704 from the environmental system 606 may be connected to the second command wire 710 of the controller 608 through a resistance circuit 902. The resistance circuit 902 may include a relatively small resistance (e.g., 10Ω). The size of the small resistance may be configured such that only a small voltage drop occurs across the resistance circuit 902 the controller 608 harvest power. For example, some controllers 608 may use between 10 mA and 350 mA of current when harvesting power from the environmental system 606. As described below, the resistance circuit 902 may include a larger resistance and/or additional circuitry to automatically increase the resistance provided by the resistance circuit 902 when the switch 610 of the controller 608 causes short-circuit current to flow through the resistance circuit 902.

The intermediate device may also include a current monitor 904. The current monitor 904 may be configured to monitor current flowing between the power wire connector and the second command wire connector of the intermediate device 702. For example, the current monitor 904 may monitor current passing between a C wire 704 and the environmental system 606 and the W wire 710 from the controller 608. The current monitor may be implemented using any technique or circuit for monitoring current across a resistance. For example, the current monitor 904 may be implemented using a voltage measurement circuit, a sense amplifier, differential amplifier, or any other method of measuring a voltage drop across the resistance circuit 902. The resistance circuit 902 may produce a known resistance, and a voltage drop across the resistance circuit 902 may be used to calculate the current through the resistance circuit 902. Therefore, measuring and/or detecting a current between the power wire connector and the second command wire connector may include measuring a voltage and comparing the voltage to a threshold voltage.

In contrast to previous systems, the intermediate device 702 may provide a connection from the power wire 704 from the environmental system 606 to the second command wire 710 of the controller 608 through the resistance circuit 902. Recall from the discussion above that the controller 608 includes a power system 614 that is configured to harvest power from the second command wire 710. In previous implementations, the second command wire 710 was connected to an actual command wire from the environmental system 606, such as a W wire from an HVAC system. This limited the amount of power that could be harvested from the environmental system 606 without triggering the environmental system function associated with that command wire. However, in these embodiments, the second command wire 710 may be connected to the power wire 704 from the environmental system 606, thereby providing a greater amount of power from the environmental system 606 than could otherwise be safely harvested by the power system 614 of the controller 608.

In addition to measuring/monitoring the current through the resistance circuit 902, the current monitor 904 may also detect when the current exceeds a threshold. The threshold may be set such that it is above the amount of current harvested by the power system 614 under normal conditions. When the current monitor 904 determines that the current has not exceeded this threshold, this may be indicative of a normal amount of current that is used to power the controller as it is harvested through the power system 614. When the current through the resistance circuit 902 exceeds this threshold, it may be an indication that the switch 610 has closed at the controller 608, thereby indicating that the controller 608 is calling for the function associated with the second command wire 710. For example, a solid-state relay (SSR) may be closed by the controller 608 to call for a heating function on the W wire for thermostat implementations. This may greatly increase the current flowing through the resistance circuit 902, as the switch 610 will effectively short the power wire 704 to the first return wire 708. When the threshold is exceeded, the current monitor 904 may output a signal to an output circuit 908. As will be described in greater detail below, some embodiments may also cause the resistance circuit 902 to switch from a low resistance value to a high resistance value when this threshold is exceeded.

The output circuit 908 may be configured to receive the indication that the threshold has been exceeded from the current monitor 904 and close a switch 910 on the intermediate device 702 to activate the function at the environmental system 606. The switch 910 may create a connection between the first command wire 706 and the first return wire 708. Thus, instead of allowing the controller 608 to directly connect the first command wire 706 to the first return wire 708 through the switch 610 of the controller 608, these embodiments instead use a switch 910 of the intermediate device 702 to establish this connection.

Figure 10:
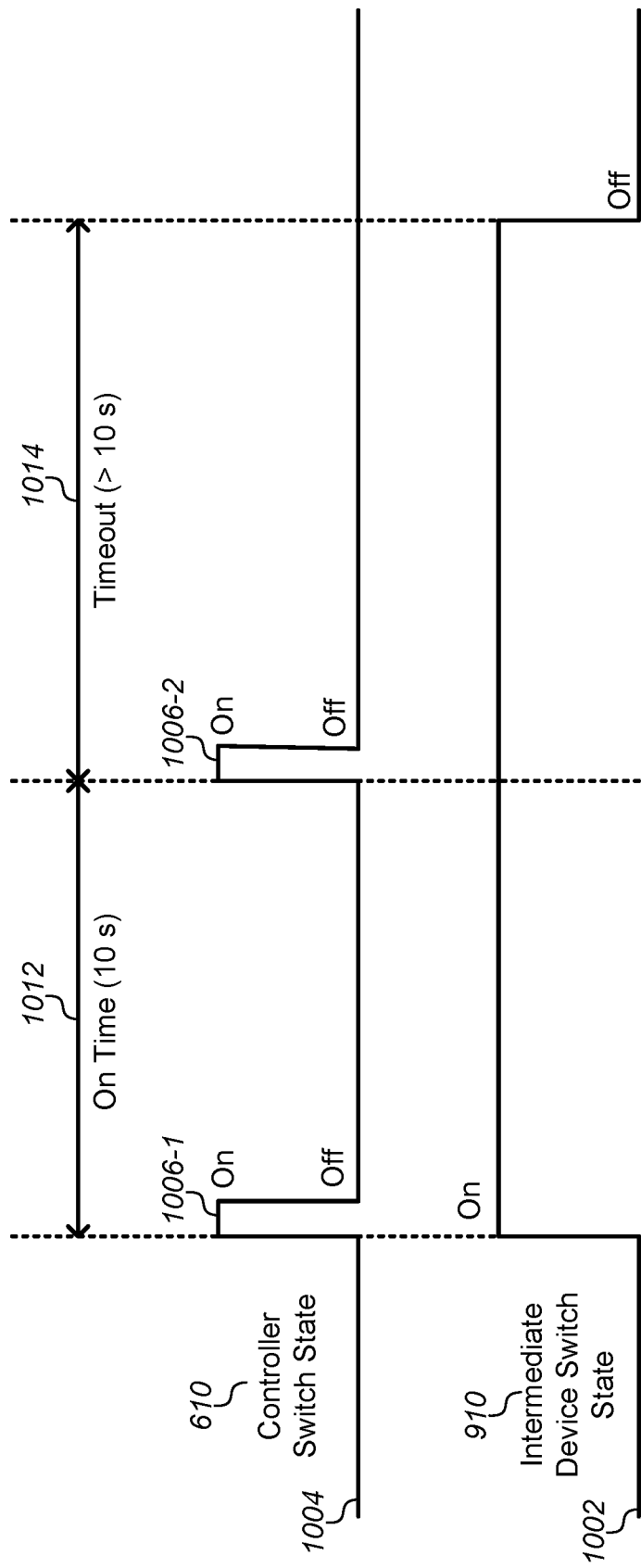
FIG. 10 illustrates a timing diagram for the switch at the controller and the switch at the intermediate device, according to some embodiments.

FIG. 10 illustrates a timing diagram for the switch 610 at the controller 608 and the switch 910 at the intermediate device 702, according to some embodiments. When the controller 608 is connected directly to the environmental system 606, the switch 610 at the controller 608 may close and remain closed to continuously call for the function of the environmental system 606. For example, a thermostat may close the switch between the W wire and the R wire, and in response an HVAC system may activate a heating function for as long as the switch is closed. However, in order to allow the controller 608 to harvest power through the voltage differential between the second command wire 710 and the second return wire 712, the switch 610 of the controller 608 should remain open as long as possible. Therefore, some embodiments may configure the intermediate device 702 to provide a continuous function call to the environmental system 606 while receiving pulsed inputs from the controller 608.

The controller switch state 1004 may be pulsed from an OFF state to an ON state and back to the OFF state at regular intervals. For example, some embodiments may use a time interval of approximately 10 seconds between pulses. The pulse widths may be approximately 5 ms. Note that these times are provided only by way of example and may be adjusted depending on the needs of the particular embodiment without limitation. The time interval 1012 between pulses 1006 may indicate to the intermediate device 702 that the function associated with the command wire should be activated and/or maintained. If a pulse is not received from the controller 608 for a time that is longer than the time interval 1012, such as a timeout interval 1014, then the intermediate device 702 may open the switch 910 to discontinue the call for the environmental function from the environmental system 606.

In the example of FIG. 10, a first pulse 1006-1 may be received from the controller 608, which in turn may cause the switch state 1002 of the intermediate device 702 to turn on (e.g., cause the switch 910 to close). The output circuit 908 of the intermediate device 702 may include a delay element 906 that maintains a signal to the switch 910 for at least the length of the time interval 1012 between the pulses 1006. For example, a second pulse 1006-2 may be received from the controller 608 after the time interval 1012. Because the second pulse 1006-2 is received within a time interval that does not exceed the timeout interval 1014, the delay element 906 may continue to output the signal (e.g., a logic "1") to the switch 910 such that the switch 910 remains closed. The pulses 1006 may be received indefinitely from the controller 608 at regular intervals until the controller 608 determines that the function of the environmental system 606 should be discontinued, at which point the controller 608 may cease sending the pulses 1006. After the final pulse is sent and the timeout interval 1014 is exceeded, the delay element 906 at the intermediate device 702 may send a signal that causes the switch 910 to open (e.g., a logic "0").

Figure 11:
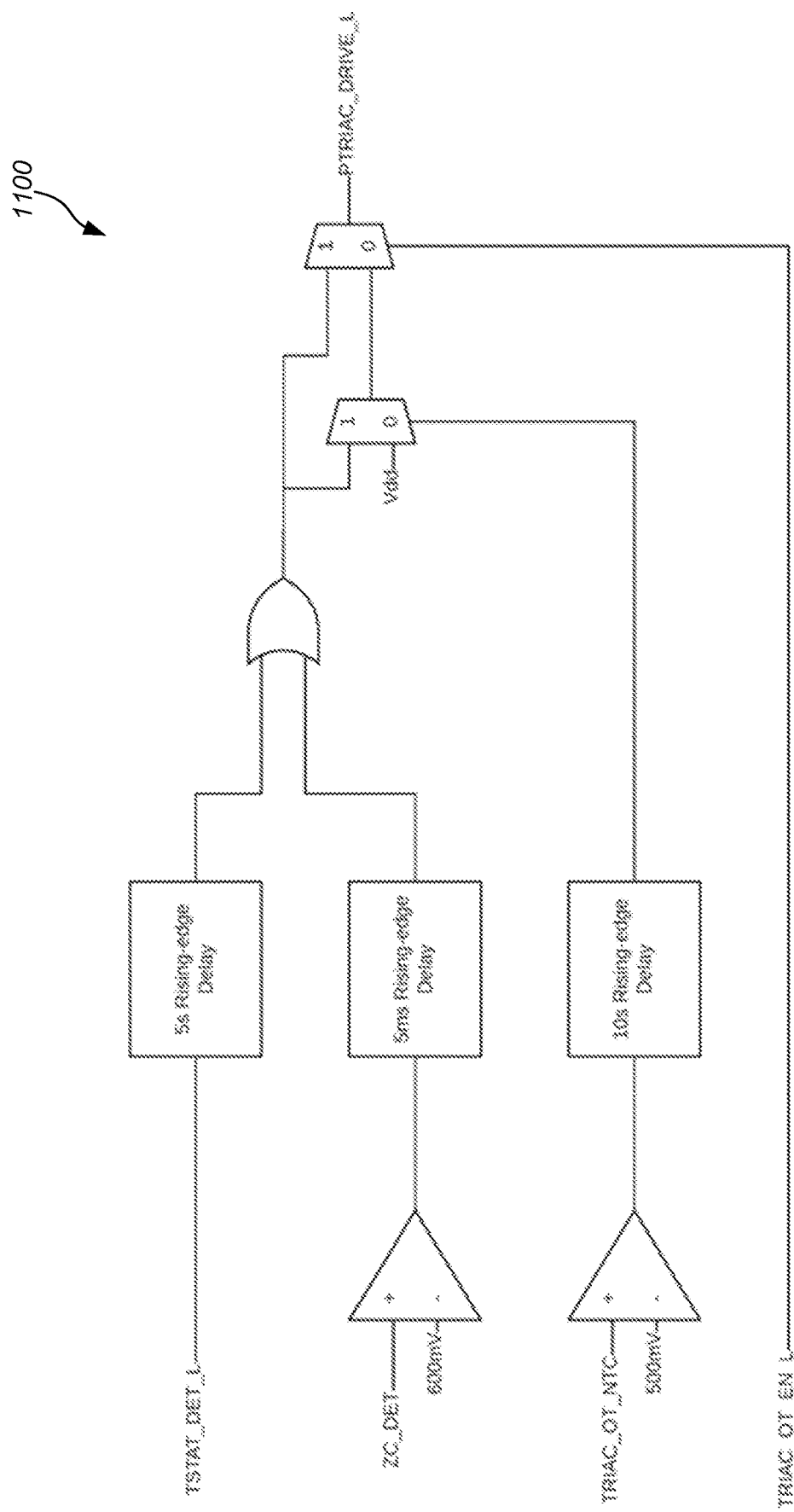
FIG. 11 illustrates a switch controller circuit that may be implemented as part of the delay element of the output circuit of the intermediate device, according to some embodiments.

The delay element 906 of the output circuit 908 may be implemented using a microcontroller, logic gates (e.g, AND, NAND, OR, etc., gates), a sample-and-hold circuit, and/or other similar digital implementations. FIG. 11 illustrates a switch controller circuit 1100 that may be implemented as part of the delay element 906 of the output circuit 908 of the intermediate device 702, according to some embodiments. The switch controller circuit 1100 may utilize various inputs to generate a single output that drives the switch 910. TSTAT_DET_L may represent a digital input from a controller detection circuit (active low). ZC_DET may represent an analog input for zero-cross detection circuit (e.g., an AC voltage signal, full-wave rectified and divided down to scale). TRIAC_OT_NTC may represent an analog input for over-temperature detection (e.g., generated by a voltage divider with NTC to ground). This voltage may be inversely proportional to temperature. TRIAC_OT_EN_L may represent a digital input controlling an over-temperature feature. PTRIAC_DRIVE_L may represent an open-drain digital output controlling switch, such as switch 910. When the controller applies a short between the second command wire 710 and the second return wire 712, the current monitor 904 may pull the TSTAT_DET_L input low, prompting the output circuit to activate the PTRIAC_DRIVE_L output. In this example, a 5 second rising-edge delay may be applied to the TSTAT_DET_L input. This allows the controller 608 to enable the switch 910 continuously, while only enabling its own control switch 610 momentarily as described above. This allows the same amount of power to be available to the controller 608 whether or not the environmental system 606 is currently activated.

The switch 910 may be implemented using MOSFETs or other SSR circuits. Some embodiments may use a triode for alternating current (TRIAC) device or a phototriac device. Other embodiments may implement the switch 910 with an SSR IC that is used in the controller 608 as described in detail below. In embodiments where the SSR IC is used, some of the internal blocks of the SSR IC may potentially be used instead of discrete external circuits. For example, the current detection in a second SSR channel may be used as the current monitor to detect if the controller is calling for a heat/cool function and increase the resistance if the current is over a threshold. Internal over-temperature sensors may be used in conjunction with a backup external thermistor and the internal zero-cross detection may be used instead of an external circuit.

Figure 12:
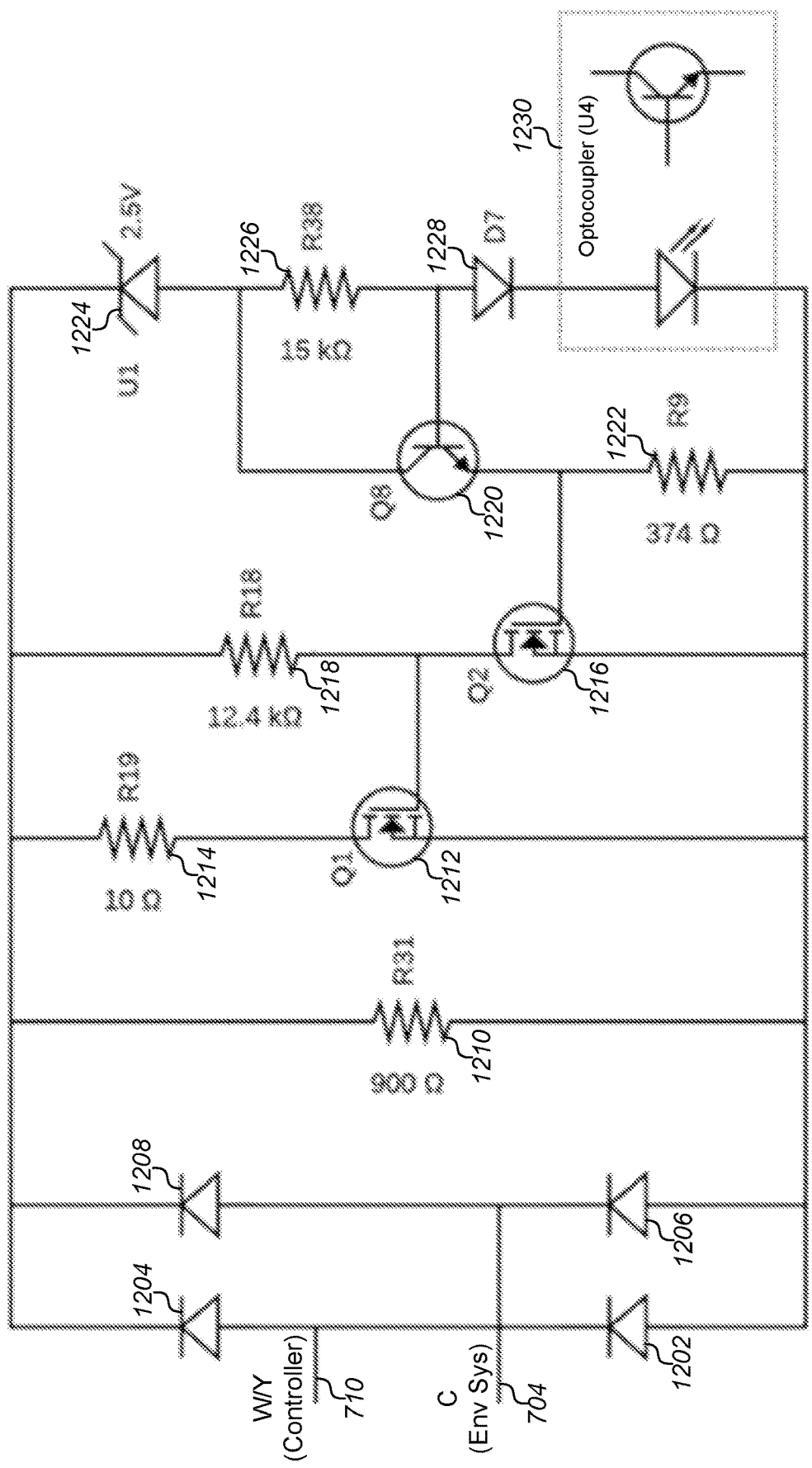
FIG. 12 illustrates an implementation of a resistance circuit, according to some embodiments.

FIG. 12 illustrates an implementation of a resistance circuit 902, according to some embodiments. As previously illustrated in FIG. 9, the inputs to the resistance circuit 902 include the wire connector that is connected to the second command wire 710 from the controller 608 (e.g., the W/Y wire from a thermostat) and the wire connector that is connected to the power wire 704 from the environmental system 606 (e.g., the C wire from an HVAC system). The circuit illustrated in FIG. 12 includes elements of the resistance circuit 902 and/or the current monitor 904 as described in detail below. This circuit may be configured to perform a number of different functions. First, the circuit may be configured to provide a low impedance return path to a transformer of the environmental system 606, thus allowing the controller 608 to draw power between the second command wire and the second return wire connectors. Second, the circuit may be configured to sense a short-circuit at the controller 608, thus indicating that the controller has activated the command for that wire to call for the specified environmental function. In order to limit the current on the second command wire 710 when these wires are shorted together and thus prevent damage to the environmental system transformer and/or the controller 608, this circuit may also switch to a higher resistance to limit the current flow while still providing enough current to support previous power-harvesting designs. These low and high resistances may be referred to as a first and second resistance, respectively.

The circuit may implement these functions by switching a low-impedance path in and out of a parallel connection with a sufficiently high-impedance path based on a predetermined detection threshold. So long as the current on the second command wire 710 remains below this threshold, the circuit presents the low-impedance path that provides the maximum power delivery to the controller 608 from the power wire 704. However, when the current on the second command wire 710 exceeds the threshold, the circuit may disconnect the low-impedance path and instead direct the current through the higher-impedance path between the controller 608 and the transformer of the environmental system 606, while still providing sufficient power for previous power-harvesting controller designs that are not configured to provide pulsed signals instead of continuous signals. This acts as a safety feature to prevent excessive heat buildup and current flow when a legacy controller that is not specifically configured to operate the pulsed function call described above is connected to the intermediate device 702.

When a controller activates its (second) command wire, applying a short-circuit between the second command wire in the second return wire, the detection circuit may switch between the low-impedance and high-impedance paths at the beginning and end of each half of an AC cycle. The current monitor portion of the circuit may determine the current in the second command wire 710 based on a proportional voltage drop across the detection circuit. Current may increase at the start of each half cycle until a sufficient voltage drop across the resistance causes the state to switch from low-impedance to high-impedance. Though current in the circuit immediately decreases to a significantly smaller value, the initial voltage drop remains above the detection threshold, such that the detection circuit stays in the high-impedance state until the end of the AC half cycle when the sinusoidal waveform returns to zero. Thus, the detection begins and ends each half cycle in the low-impedance state. An example waveform is illustrated below in FIG. 16.

In the circuit of FIG. 12, transistor 1212 and resistor 1214 form the primary path for the current in the low-impedance state. In some embodiments, the value for resistor 1214 may be approximately 10Ω. When a short between the second command wire 710 and the second return wire is initiated at the controller 608, the current will increase dramatically in this low-impedance pathway. Eventually, the voltage drop across resistance 1214 may exceed the gate voltage of transistor 1212. At this point, the total voltage drop across the detection circuit may increase linearly with the current through the circuit.

A precision voltage reference 1224 may act much like a Zener diode and a shunt regulator circuit to implement the threshold current detection. This may control the gate voltage of transistor 1216 to switch between the low-impedance state and the high-impedance state. As the voltage drop across the detection circuit exceeds a configured "breakdown" voltage, the precision voltage reference 1224 may begin conducting and activate transistor 1216 to switch into the high-impedance state. This may also activate an optocoupler 1230 which signals the output circuit to activate the switch 910 as described above.

Almost the entire transformer voltage may be dropped across this detection circuit once it transitions into the high-impedance state. Avoiding excessive current flow through the optocoupler 1230 and excessive gate voltage at transistor 1216 under this condition may require a sufficient series impedance. However, with too much impedance, the leakage current through the precision voltage reference 1224 may activate transistor 1216 before the precision voltage reference 1224 reaches its breakdown voltage. Using transistor 1220 as a shunt regulator solves these problems. The optocoupler 1230 diode and a general-purpose diode 1228 may bias transistor 1220 to regulate the gate voltage at transistor 1216 in the low-impedance state. The excess voltage from the transformer of the environmental system 606 may drop across transistor 1220. This also allows a large resistance 1226 to limit current in both diodes. While in the low-impedance state, the leakage current through the precision voltage reference 1224 may find a low-impedance path through transistor 1220 and resistor 1222, which may prevent the gate voltage of transistor 1216 from exceeding its threshold voltage. Resistor 1210 is in the main current path when in the high-impedance state, and resistor 1214 is the main current path when in the low-impedance state.

Note that resistor 1210 and resistor 1214 may be implemented as multiple series and/or parallel combinations of discrete resistors to achieve a target value. This may spread the heat dissipation between multiple resistive elements. Therefore, reference to either of these resistors interpreted to include references to multiple resistors that may be combined to achieve a target value. For example, either of these resistances may be implemented using three or four #1206 packages in parallel.

Figure 13:
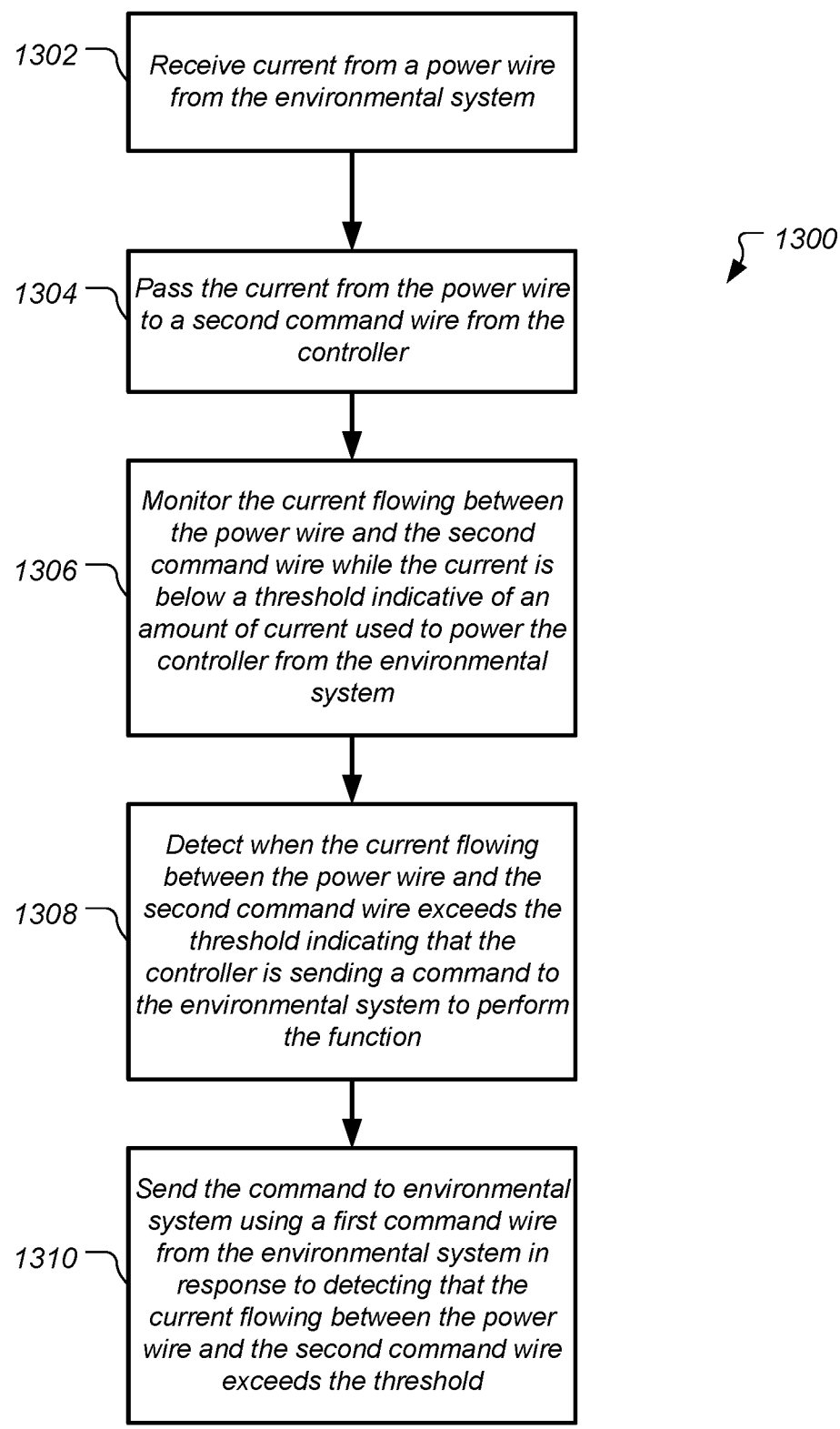
FIG. 13 illustrates a flowchart of method for powering a controller using power from an environmental system through an intermediate device, according to some embodiments.

FIG. 13 illustrates a flowchart 1300 of method for powering a controller using power from an environmental system through an intermediate device, according to some embodiments. This method may be carried out by the intermediate device 702 described above. The intermediate device may be in a wired connection with environmental system, such as an HVAC system, and in a wired connection with a controller, such as the thermostat. Other environmental systems and/or smart-home controller devices may be used interchangeably in this method.

The method may include receiving, by the intermediate device, current from a power wire from the environmental system (1302). The current may be part of a 24 VAC signal provided from the environmental system. The current may be sourced from a dedicated power connection on the environmental system, such as a terminal for a C wire on an electrical panel or connection of the environmental system. A command wire may include a call relay wire meant to provide an output for a triggering circuit of the environmental system, such as a 24 VAC signal.

The method may also include passing, by the intermediate device, the current from the power wire to a second command wire from the controller, wherein the second command wire is associated with a function of the environmental system (1304). The second command wire may be connected to a command wire connector of the controller, such as a W connector or a Y connector of a thermostat. This connector may be associated with a specific function of the environmental system, such as a heating function or a cooling function of an HVAC system. Note that this may be contrasted with a dedicated power wiring connector for the controller, such as a C wire connector on a thermostat. The intermediate device may allow current from the power wire of the environmental system to pass into the command wire of the controller. Note that the term "first" in this discussion describes wiring connectors and/or wires between the environmental system and the intermediate device, while the term "second" in this discussion describes wiring connectors and/or wires between the intermediate device and the controller.

The method may additionally include monitoring, by the intermediate device, the current flowing between the power wire and the second command wire while the current is below a threshold indicative of an amount of current used to power the controller from the environmental system (1306). While the amount of current used to power the controller is below the threshold, the intermediate device may provide a low-impedance path through a resistance circuit between the power wire and the second command wire. The controller may harvest power from the second command wire.

The method may further include detecting, by the intermediate device, when the current flowing between the power wire and the second command wire exceeds the threshold, indicating that the controller is sending a command to the environmental system to perform the function (1308). As described above, sending a command to the environmental system may include creating an electrical short through a switch between the second command wire and a second return wire. This may create a relatively large current through the resistance circuit in the intermediate device, which may be detected by a current monitor of the intermediate device. In some embodiments, the intermediate device may switch to a high-impedance pathway between these two wiring connectors and may generate an output indicating that the intermediate device should send a command to the environment system to perform the corresponding function. As described above in FIG. 10, the controller may pulse its internal switch at regular intervals to indicate to the intermediate device that the intermediate device should call for the environmental function.

The method may also include sending, by the intermediate device, the command to the environmental system using a first command wire from the environmental system in response to detecting that the current flowing between the power wire and the second command wire exceeds the threshold (1310). The first command wire may be associated with the function of the environmental system, and may be separate and distinct from the power wire from the environmental system. For example, the first command wire may include a W wire or a Y wire associated with heating/cooling functions of an HVAC system. The output circuit may trigger on a pulsed input or rising edge from the current monitor of the intermediate device. The output circuit may cause a connection between the first command wire and a first return wire that is held for a time interval (e.g. more than 5 or 10 seconds), which thereby allows the duty cycle of the switch at the controller to be very high (e.g., greater than 99%).

It should be appreciated that the specific steps illustrated in FIG. 13 provide particular methods of powering a controller using power from an environmental system through an intermediate device according to various embodiments. Other sequences of steps may also be performed according to alternative embodiments. For example, alternative embodiments may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 14:
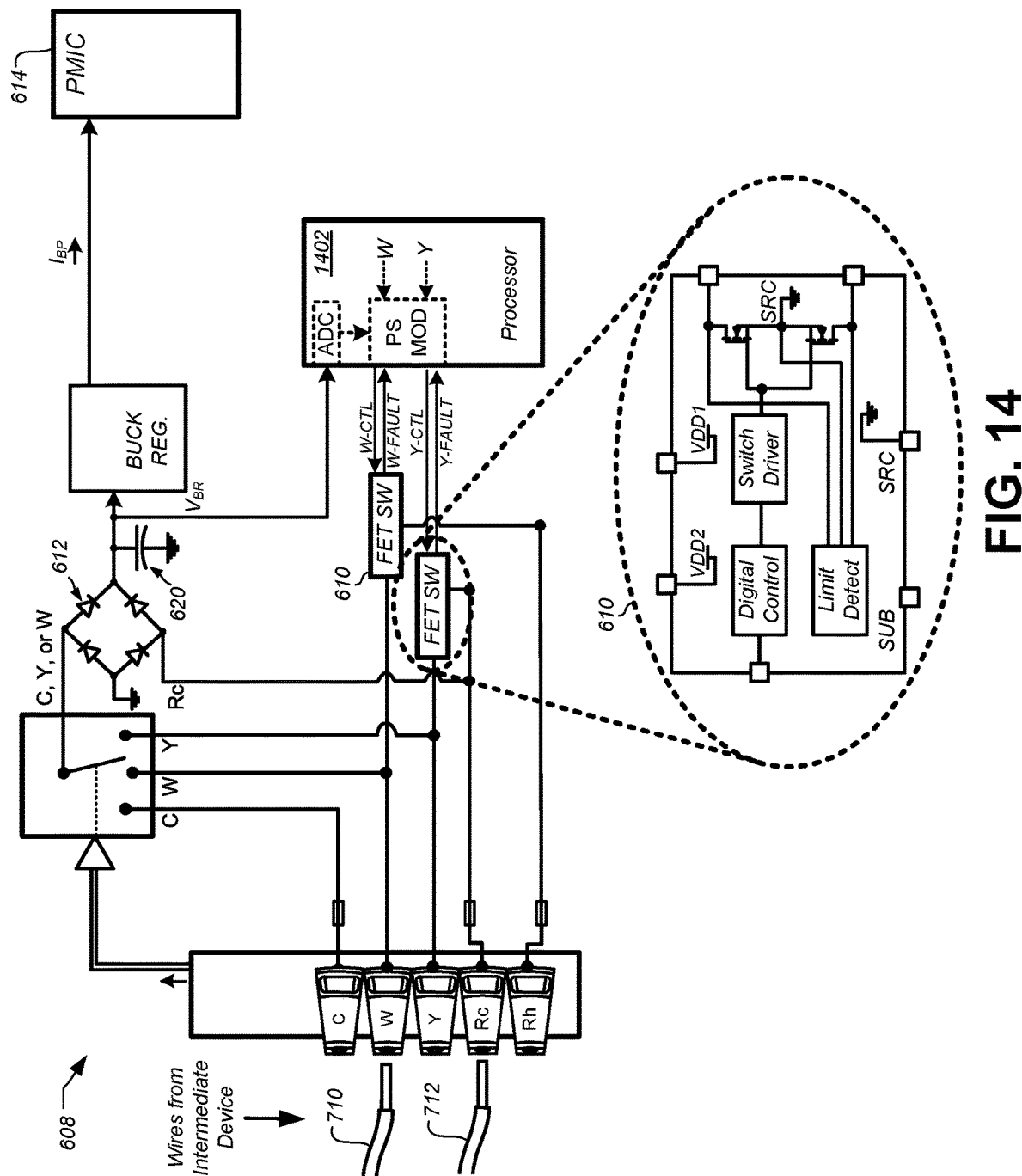
FIG. 14 illustrates a circuit diagram of a controller that interacts with the intermediate device, according to some embodiments.

Turning now to the operation of the controller, FIG. 14 illustrates a circuit diagram of an example controller that interacts with the intermediate device, according to some embodiments. FIG. 14 illustrates a simplified example of the controller 608 from FIG. 6. As described above, a power system 614 may receive current through a bridge rectifier 612 that stores charge on an energy-storage device 620 for providing power to the controller 608. Various methods may be used to detect whether a C wire is present. In the embodiments described herein where an intermediate device 702 is present, it is likely that no C wire is connected between the environmental system 606 and the controller 608. Various methods may also be used to choose between the available command wires for the power-harvesting operation. For example, mechanical causation, wire insertion sensors, diode circuits, voltage detection, and other methods may be used to choose between, for example, a W wire and/or a Y wire connector for the power-harvesting operation. When a command wire is used for power harvesting, the voltage difference between a return wire and the command wire is used by the power system 614.

The switch 610 may be activated by a processor 1402 when the controller calls for an environmental function from the environmental system. In some embodiments, the switch 610 may be implemented using MOSFETs, relays, or other switching devices. In other embodiments, a dedicated SSR IC as described below may be used to implement one or more of the switches 610. Different types of SSR IC packages may be used for this component, and one is described in detail below.

Figure 15:
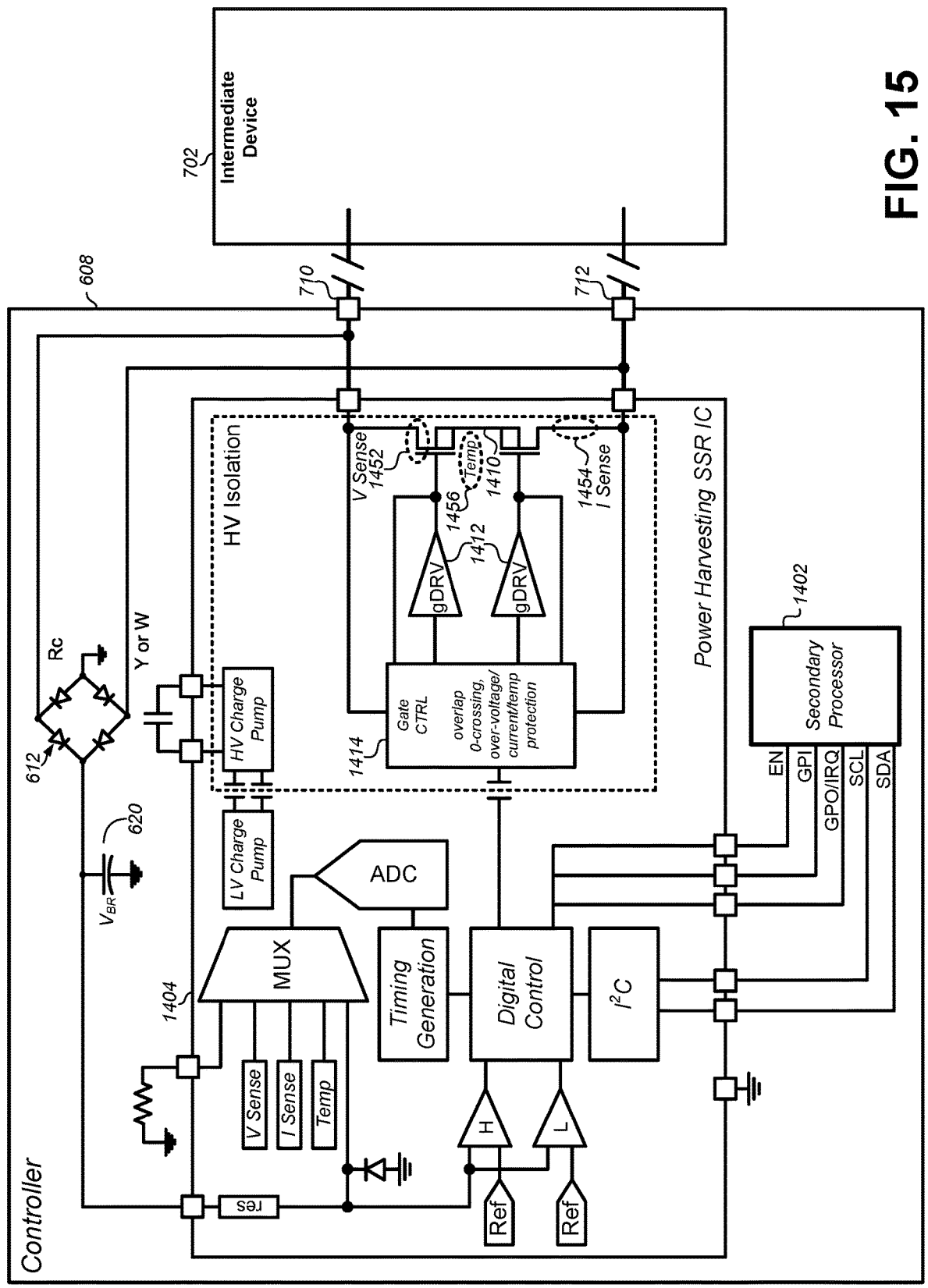
FIG. 15 illustrates a simplified system diagram of an SSR IC, according to some embodiments.

FIG. 15 illustrates a simplified system diagram of an SSR IC, according to some embodiments. This SSR IC 1404 is described in detail in the commonly assigned U.S. application Ser. No. 15/680,632, filed Aug. 18, 2017, entitled "POWER MANAGEMENT INTEGRATED CIRCUIT," which is incorporated herein by reference. The SSR IC 1404 may perform many different functions, including implementing the switching function that connects the second command wire 710 to the second return wire 712. The switches may be implemented using power MOSFETs that are controlled by a voltage isolated controller 1414 from the processor 1402.

Besides the basic switching function, the SSR IC 1404 may also include onboard overvoltage and/or overcurrent detection and protection, along with integrated telemetry sensors and reporting capabilities. The SSR IC 1404 may include a temperature sensor 1456, voltage sensors 1452, and/or current sensors 1454 that measure voltage, current, and temperature through the switches during operation. These values may be sampled continuously during switching operations, including during the time when a command is being sent to the environmental system through the intermediate device. For example, part of the overcurrent protection circuit of the SSR IC 1404 may include detecting a high current through the switches and automatically turning the switches off at the next zero-crossing event. Additionally, some embodiments may automatically time turning on the switches at a maximum voltage and/or current peak in the AC waveform.

Figure 16:
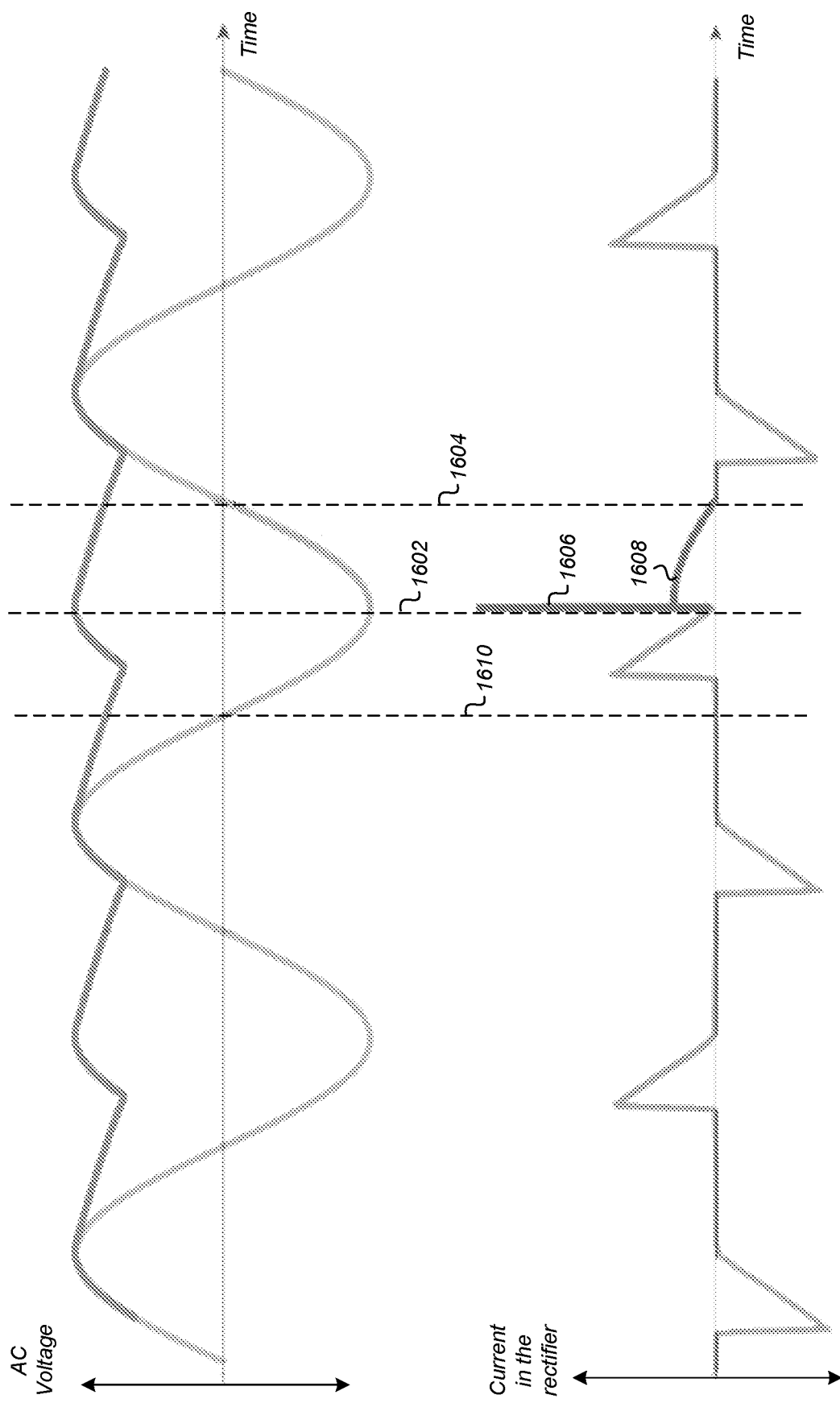
FIG. 16 illustrates an example waveform for the SSR IC, according to some embodiments.

FIG. 16 illustrates an example waveform for the SSR IC, according to some embodiments. As described above, the controller may only need to send out relatively short pulses in order to send a command to the intermediate device rather than continuously shorting the second command wire to the second return wire. In some embodiments, it may be advantageous to begin each of these pulses at a peak in the input AC voltage waveform. As described above, the SSR IC may include zero-crossing detection circuitry that can automatically close the switches relative to a zero-crossing event. In this example, the SSR IC may detect a zero crossing at time 1610. In order to turn the switches on at a peak in the rectified voltage waveform, the SSR IC may wait a quarter cycle before turning on the switches. For example, some embodiments may delay turning on the switches by 4 ms after a zero-crossing event.

After the delay following the zero-crossing event the switches may close at time 1602. This may result in a momentary current spike 1606 in the current in the rectifier of the controller. As described above, when this current spike is detected, the intermediate device may switch to a high-impedance current pathway, thereby lowering the current spike to a relatively smaller level, and the smaller current 1608 may decrease through the remaining quarter cycle of the AC waveform. The zero-crossing detection circuitry may again be employed to turn off the switches at the next zero crossing at time 1604.

The software that controls the switching of the SSR IC in the processor may be configured to operate with and/or without the intermediate device. If the intermediate device is present, the processor of the controller may send pulsed outputs by closing the switches at regular intervals as described above. However, if the intermediate device is not present, then the controller may act in the traditional fashion by continuously closing the SSR IC between the second command wire connector and the second return wire connector as long as the function of the HVAC system is activated. The controller may then momentarily open the switch to perform active power harvesting as described above.

In order to determine whether the intermediate device is present, the controller may execute a test algorithm whenever the controller is reset, powered up, updated, rebooted, installed, or undergoes any other event when the intermediate device may be installed. For example, some embodiments may turn on the switches for a full AC cycle and record the maximum current in the current waveform buffer using the telemetry system described above for the SSR IC. The samples for the current waveform may be passed through a low-pass digital filter (e.g., with a cutoff frequency of approximately 100 Hz), which may yield a sinusoidal AC component. The RMS of that sinusoidal AC component may then be calculated. The ratio between the peak current and the RMS current may be calculated and compared to a threshold. For example, a perfect sinusoidal will have a ratio of 1.4 between the peak value and the RMS value. If the measured ratio is above that value by a threshold amount, then it is likely that the current spike 1606 followed by the smaller current 1608 is present when the switch is turned on, thereby indicating that the intermediate device is present and switching from the low-impedance path to the high-impedance path. Other embodiments may use different statistical methods and/or comparisons to detect whether the intermediate device is present. Some embodiments may also allow the user to specify that an intermediate device is present through a selection made through a user interface of the controller.

Figure 17:
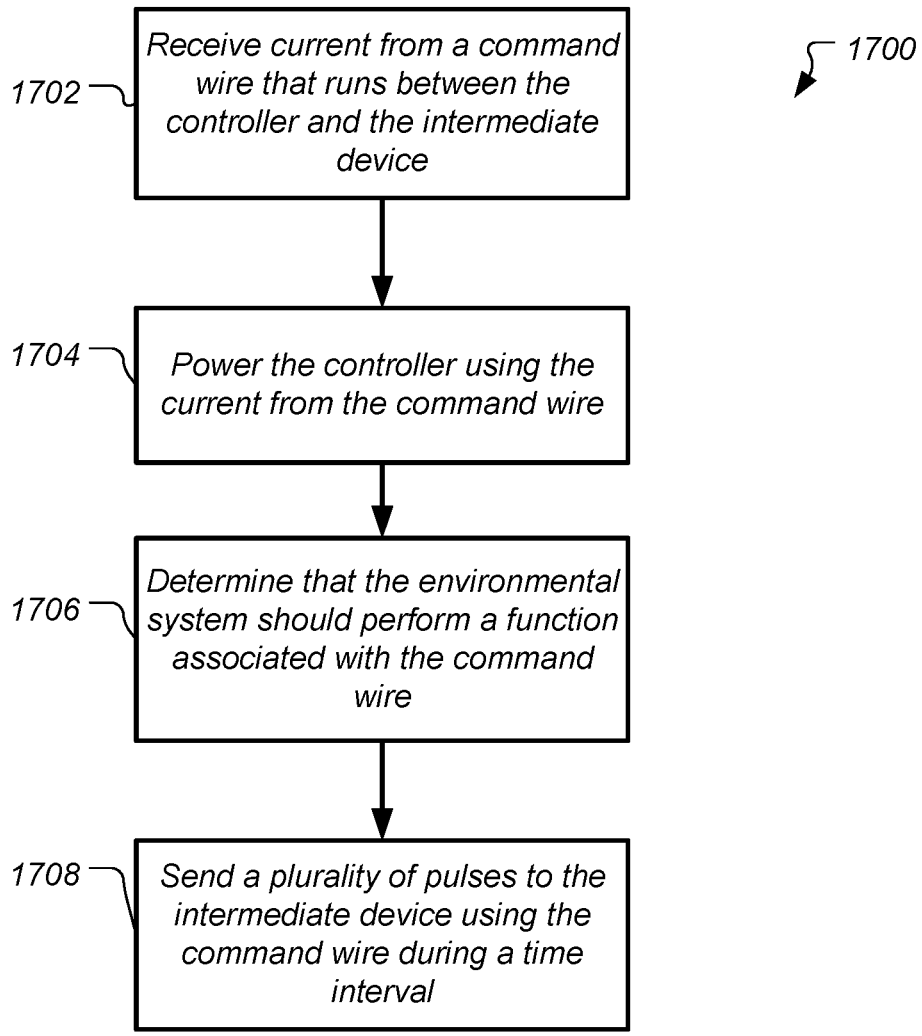
FIG. 17 illustrates a flowchart of a method of sending a command from a controller to an environmental system through an intermediate device, according to some embodiments.

FIG. 17 illustrates a flowchart 1700 of a method of sending a command from a controller to an environmental system through an intermediate device, according to some embodiments. This method may be carried out by a controller, such as a thermostat or other smart-home device. The controller may include one or more series switches that connect the second command wire to the second return wire. Some embodiments may also include an SSR IC as described above with zero-crossing detection circuitry that can initiate opening/closing the switches, along with telemetry that measures the instantaneous current, voltage, and/or temperature through the SSR IC. Note that the SSR IC is not required, and some embodiments may function adequately using regular switches controlled by a processor or other control device.

The method may include receiving, by the controller, current from a command wire that runs between the controller and the intermediate device (1702). The current may be provided to the intermediate device from a power wire from the environmental system. The controller may harvest power from the command wire using the power from the environmental system. This power harvesting may continue while the switch between the two wire connectors remains open.

The method may also include powering the controller using the current from the command wire (1704). The controller may be powered by passing the signal received from the command wire to a bridge rectifier that charges an energy storage element, such as a capacitor. The voltage on the capacitor may then be input into a voltage regulator that provides a regulated voltage to a power system for the controller.

The method may additionally include determining, by the controller, that the environmental system should perform a function associated with the command wire (1706). The controller may determine that the environmental system should perform a function based on a predetermined set point in a set point schedule or an immediate input provided by a user through a user interface. For example, a thermostat may monitor an ambient temperature and cause a heating/cooling function to be initiated at an HVAC system when the ambient temperature deviates from a setpoint temperature as specified by a user or a schedule of setpoint temperatures.

The method may further include sending, by the controller, a plurality of pulses to the intermediate device using the command wire during a time interval (1708). The intermediate device may cause the environmental system to continuously perform the function during the time interval, in response to receiving the plurality of pulses. These pulses may be sent in contrast to the single pulse that was previously sent by the controller that continuously shorted the command wire and the return wire for the duration of the command. In some embodiments, the duty cycle of these pulses may be greater than 95%. Some embodiments may also run a test to determine whether the intermediate device is present by sending a signal on the command wire (e.g., shorting it to the return wire) and measuring the resulting current waveform.

It should be appreciated that the specific steps illustrated in FIG. 17 provide particular methods of sending a command from a controller to an environmental system through an intermediate device according to various embodiments. Other sequences of steps may also be performed according to alternative embodiments. For example, alternative embodiments may perform the steps outlined above in a different order. Moreover, the individual steps illustrated in FIG. 17 may include multiple sub-steps that may be performed in various sequences as appropriate to the individual step. Furthermore, additional steps may be added or removed depending on the particular applications. Many variations, modifications, and alternatives also fall within the scope of this disclosure.

The Smart-Home Environment

Figure 18:
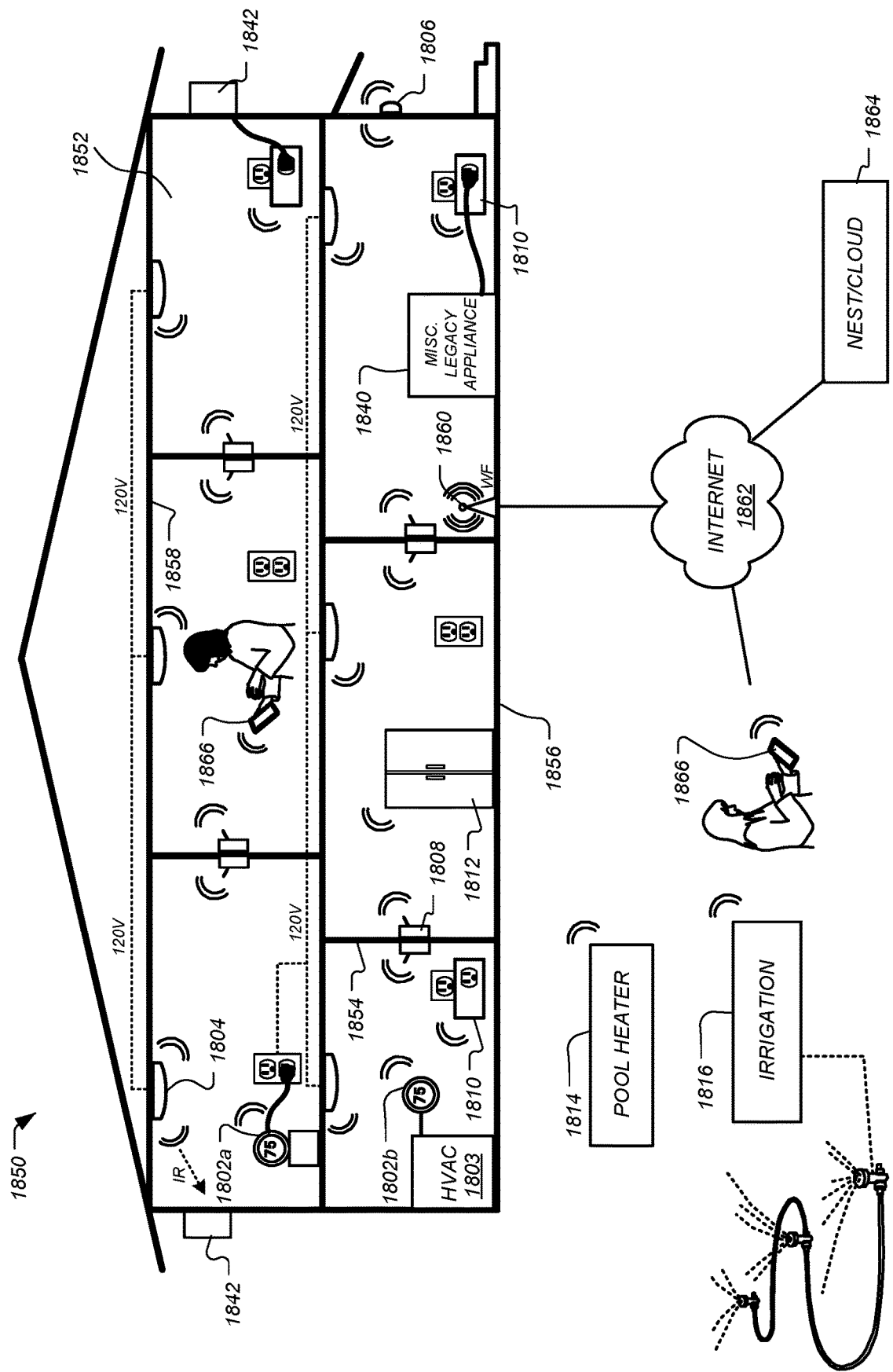
FIG. 18 illustrates an example of a smart home environment within which one or more of the devices, methods, systems, services, and/or computer program products described further herein can be applicable.

FIG. 18 illustrates an example of a smart home environment within which one or more of the devices, methods, systems, services, and/or computer program products described further herein can be applicable. The depicted smart home environment includes a structure 1850, which can include, e.g., a house, office building, garage, or mobile home. It will be appreciated that devices can also be integrated into a smart home environment that does not include an entire structure 1850, such as an apartment, condominium, or office space. Further, the smart home environment can control and/or be coupled to devices outside of the actual structure 1850. Indeed, several devices in the smart home environment need not physically be within the structure 1850 at all. For example, a device controlling a pool heater or irrigation system can be located outside of the structure 1850.

The depicted structure 1850 includes a plurality of rooms 1852, separated at least partly from each other via walls 1854. The walls 1854 can include interior walls or exterior walls. Each room can further include a floor 1856 and a ceiling 1858. Devices can be mounted on, integrated with and/or supported by a wall 1854, floor or ceiling.

The smart home depicted in FIG. 18 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 18.

An intelligent, multi-sensing, network-connected thermostat 1802 can detect ambient climate characteristics (e.g., temperature and/or humidity) and control a heating, ventilation and air-conditioning (HVAC) system 1803. One or more intelligent, network-connected, multi-sensing hazard detection units 1804 can detect the presence of a hazardous substance and/or a hazardous condition in the home environment (e.g., smoke, fire, or carbon monoxide). One or more intelligent, multi-sensing, network-connected entryway interface devices 1806, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 1808 can detect ambient lighting conditions, detect room-occupancy states and control a power and/or dim state of one or more lights. In some instances, light switches 1808 can further or alternatively control a power state or speed of a fan, such as a ceiling fan. Each of a plurality of intelligent, multi-sensing, network-connected wall plug interfaces 1810 can detect occupancy of a room or enclosure and control supply of power to one or more wall plugs (e.g., such that power is not supplied to the plug if nobody is at home). The smart home may further include a plurality of intelligent, multi-sensing, network-connected appliances 1812, such as refrigerators, stoves and/or ovens, televisions, washers, dryers, lights (inside and/or outside the structure 1850), stereos, intercom systems, garage-door openers, floor fans, ceiling fans, whole-house fans, wall air conditioners, pool heaters 1814, irrigation systems 1816, security systems (including security system components such as cameras, motion detectors and window/door sensors), and so forth. While descriptions of FIG. 18 can identify specific sensors and functionalities associated with specific devices, it will be appreciated that any of a variety of sensors and functionalities (such as those described throughout the specification) can be integrated into the device.

In addition to containing processing and sensing capabilities, each of the devices 1802, 1804, 1806, 1808, 1810, 1812, 1814 and 1816 can be capable of data communications and information sharing with any other of the devices 1802, 1804, 1806, 1808, 1810, 1812, 1814 and 1816, as well as to any cloud server or any other device that is network-connected anywhere in the world. The devices can send and receive communications via any of a variety of custom or standard wireless protocols (Wi-Fi, ZigBee, 6LoWPAN, Thread, Bluetooth, BLE, HomeKit Accessory Protocol (HAP), Weave, etc.) and/or any of a variety of custom or standard wired protocols (CAT6 Ethernet, HomePlug, etc.). Each of the devices 1802, 1804, 1806, 1808, 1810, 1812, 1814 and 1816 may also be capable of receiving voice commands or other voice-based inputs from a user, such as the Google Home® interface. The wall plug interfaces 1810 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 1860. A device can further communicate with remote devices via a connection to a network, such as the Internet 1862. Through the Internet 1862, the device can communicate with a central server or a cloud-computing system 1864. The central server or cloud-computing system 1864 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 1864 to devices (e.g., when available, when purchased, or at routine intervals).

By virtue of network connectivity, one or more of the smart-home devices of FIG. 18 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 1840, such as old conventional washer/dryers, refrigerators, and the like which can be controlled, albeit coarsely (ON/OFF), by virtue of the wall plug interfaces 1810. The smart home can further include a variety of partially communicating legacy appliances 1842, such as IR-controlled wall air conditioners or other IR-controlled devices, which can be controlled by IR signals provided by the hazard detection units 1804 or the light switches 1808.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. An intermediate device for powering a controller using power from an environmental system, the intermediate device comprising:
   a plurality of wire connectors comprising:
      a power wire connector that is configured to receive a power wire from the environmental system;
      a first command wire connector that is configured to receive a first command wire from the environmental system, wherein the first command wire is associated with a function of the environmental system; and
      a second command wire connector that is configured to receive a second command wire from the controller, wherein the second command wire is associated with the function of the environmental system;
   a current monitor that is configured to:
      monitor current flowing between the power wire connector and the second command wire connector while the current is below a threshold indicative of an amount of current used to power the controller from the environmental system; and
      detect when the current flowing between the power wire connector and the second command wire connector exceeds the threshold, indicating that the controller is sending a command to the environmental system to perform the function; and
   an output circuit that is configured to send the command to the environmental system using the first command wire connector in response to detecting that the current flowing between the power wire connector and the second command wire connector exceeds the threshold.

2. The intermediate device of claim 1, wherein the plurality of wiring connectors further comprises:
   a first return wire connector that is configured to receive a first return wire from the environmental system; and
   a second return wire connector that is configured to receive a second return wire from the controller, wherein the intermediate device connects the first return wire connector to the second return wire connector.

3. The intermediate device of claim 2, wherein detecting when the current flowing between the power wire connector and the first command wire connector exceeds the threshold indicates that the controller has caused a short between the second command wire connector from the controller and the second return wire connector from the controller.

4. The intermediate device of claim 2, wherein sending the command to the environmental system using the first command wire connector comprises causing a short between the first command wire connector and the first return wire connector from the environmental system.

5. The intermediate device of claim 1, wherein the second command wire connector provides power that is harvested by the controller to power the controller and is used by the controller to activate the function of the environmental system.

6. The intermediate device of claim 1, wherein the plurality of wire connectors comprises only three wire connectors to the environmental system and only two wire connectors to the controller.

7. The intermediate device of claim 1, wherein the environmental system comprises a heating, ventilation, and air conditioning (HVAC) system, and the controller comprises a smart-home device comprising a thermostat.

8. A method of powering a controller using an intermediate device with power from an environmental system, the method comprising:
receiving, by the intermediate device, current from a power wire from the environmental system;
passing, by the intermediate device, the current from the power wire to a second command wire from the controller, wherein the second command wire is associated with a function of the environmental system;
monitoring, by the intermediate device, the current flowing between the power wire and the second command wire while the current is below a threshold indicative of an amount of current used to power the controller from the environmental system;
detecting, by the intermediate device, when the current flowing between the power wire and the second command wire exceeds the threshold indicative that the controller is sending a command to the environmental system to perform the function; and
sending, by the intermediate device, the command to the environmental system using a first command wire from the environmental system in response to detecting that the current flowing between the power wire and the second command wire exceeds the threshold, wherein the first command wire is associated with the function of the environmental system.

9. The method of claim 8, wherein monitoring the current flowing between the power wire and the second command wire while the current is below the threshold comprises:
measuring a voltage drop across a first resistance that is between the second command wire and the power wire.

10. The method of claim 9, further comprising switching the first resistance to a second resistance in response to detecting that the current flowing between the power wire and the second command wire exceeds the threshold.

11. The method of claim 10, wherein the first resistance comprises approximately 10 ohms, and the second resistance comprises approximately 900 ohms.

12. The method of claim 8, wherein detecting when the current flowing between the power wire and the second command wire exceeds the threshold comprises:
receiving a plurality of shorting pulses on the second command wire that are separated by a first time interval.

13. The method of claim 12, wherein the command to the environmental system is continually maintained during the plurality of shorting pulses.

14. The method of claim 8, wherein detecting when the current flowing between the power wire and the second command wire exceeds the threshold comprises:
receiving a continuous shorting signal on the second command wire; and
continually maintaining the command during the continuous shorting signal.

15. A method of sending a command from a controller to an environmental system through an intermediate device, the method comprising:
receiving, by the controller, current from a command wire that runs between the controller and the intermediate device, wherein the current is provided to the intermediate device from a power wire from the environmental system;
powering the controller using the current from the command wire;
determining, by the controller, that the environmental system should perform a function associated with the command wire;
sending, by the controller, a plurality of pulses to the intermediate device using the command wire during a time interval by repeatedly shorting the command wire to a return wire during the time interval, wherein the intermediate device causes the environmental system to continuously perform the function during the time interval, in response to receiving the plurality of pulses.

16. The method of claim 15, further comprising testing to determine whether the intermediate device is present by sending a signal on the command wire.

17. The method of claim 16, wherein sending the signal on the command wire comprises shorting the command wire to a return wire, and testing to determine whether the intermediate device is present comprises measuring the current through the command wire and determining whether the current is less than a threshold indicating that the intermediate device has increased a resistance through which the current flows.

18. The method of claim 15, wherein the plurality of pulses occur approximately every 5 seconds.

19. The method of claim 15, wherein the plurality of pulses are less than 10 ms wide.

20. A method of sending a command from a controller to an environmental system through an intermediate device, the method comprising:
testing to determine whether the intermediate device is present by sending a signal on a command wire that runs between the controller and the intermediate device;
receiving, by the controller, current from the command wire, wherein the current is provided to the intermediate device from a power wire from the environmental system;
powering the controller using the current from the command wire;
determining, by the controller, that the environmental system should perform a function associated with the command wire;
sending, by the controller, a plurality of pulses to the intermediate device using the command wire during a time interval, wherein the intermediate device causes the environmental system to continuously perform the function during the time interval, in response to receiving the plurality of pulses.

21. The method of claim 20, wherein sending the plurality of pulses to the intermediate device comprises:
repeatedly shorting the command wire to a return wire during the time interval.

22. The method of claim 20, wherein sending the signal on the command wire comprises shorting the command wire to a return wire, and testing to determine whether the intermediate device is present comprises measuring the current through the command wire and determining whether the current is less than a threshold indicating that the intermediate device has increased a resistance through which the current flows.

23. The method of claim 20, wherein the plurality of pulses occur approximately every 5 seconds.

24. The method of claim 20, wherein the plurality of pulses are less than 10 ms wide.

* * * * *